(12) United States Patent
Goodfellow et al.

(10) Patent No.: US 12,739,992 B2
(45) Date of Patent: Sep. 15, 2026

(54) SYSTEMS AND METHODS FOR A DEVICE MOUNT PERIPHERAL WITH INTEGRATED POWER DETECT CONNECTIVITY

(71) Applicant: JUGGERNAUT DEFENSE, LLC, Scottsdale, AZ (US)

(72) Inventors: Andrew Goodfellow, Scottsdale, AZ (US); Mark A. Goldy, Scottsdale, AZ (US); Will Bingdazzo, Scottsdale, AZ (US); Christian Johnson, Scottsdale, AZ (US)

(73) Assignee: Juggernaut Defense, LLC, Scottsdale, AZ (US)

( * ) Notice: Subject to any disclaimer, the term of this patent is extended or adjusted under 35 U.S.C. 154(b) by 127 days.

(21) Appl. No.: 18/882,579

(22) Filed: Sep. 11, 2024

(65) Prior Publication Data

US 2025/0089191 A1 Mar. 13, 2025

Related U.S. Application Data

(60) Provisional application No. 63/581,937, filed on Sep. 11, 2023.

(51) Int. Cl.
*H05K 5/02* (2006.01)

(52) U.S. Cl.
CPC .................................. *H05K 5/0247* (2013.01)

(58) Field of Classification Search
CPC .................................................... H05K 5/0247
See application file for complete search history.

(56) References Cited

U.S. PATENT DOCUMENTS

2015/0264208 A1* 9/2015 Achiwa .............. H04N 1/00885 358/1.15
2017/0293333 A1* 10/2017 Liu ......................... G06F 1/266
2019/0391627 A1 12/2019 Chavali
2020/0117258 A1* 4/2020 Ichikawa ................ G06F 1/266
2021/0288668 A1 9/2021 Xu et al.
2022/0123573 A1* 4/2022 Moubedi ................... H02J 7/62
2022/0397950 A1 12/2022 Soffer
2025/0015616 A1* 1/2025 Chen ......................... H02J 7/70

OTHER PUBLICATIONS

Patent Cooperation Treaty, International Search Report and Written Opinion, International Application No. PCT/US24/46256, Nov. 26, 2024, 9 pages.

* cited by examiner

*Primary Examiner* — Zahid Choudhury
(74) *Attorney, Agent, or Firm* — Polsinelli PC

(57) ABSTRACT

A device mount for a mobile device includes an integrated power delivery management assembly that provides a convenient and versatile solution for connection between the mobile device and an external device, where the external device may or may not be compatible with USB Type-C Power Delivery protocols. The power delivery management assembly determines, by a power delivery detect circuit, a power delivery status of the external device and configures itself accordingly. When the external device is Power Delivery incapable, the power delivery management assembly facilitates USB Type-C Power Delivery protocol between the external device and the mobile device on behalf of the external device. When the external device is Power Delivery capable, the power delivery management assembly configures itself into a "pass-through" mode to allow the external device and the mobile device to negotiate USB Type-C Power Delivery.

18 Claims, 19 Drawing Sheets

300
10
12
306
22
302
304

374
102
378
132
386
130

374
102
386
378

SYSTEMS AND METHODS FOR A DEVICE MOUNT PERIPHERAL WITH INTEGRATED POWER DETECT CONNECTIVITY

CROSS-REFERENCE TO RELATED APPLICATIONS

This is a U.S. Non-Provisional Patent Application that claims benefit to U.S. Provisional Patent Application Ser. No. 63/581,937 filed Sep. 11, 2023, which is herein incorporated by reference in its entirety.

FIELD

The present disclosure generally relates to USB device peripherals, and in particular, to a system and associated method for a Power Delivery Management assembly that can be integrated within a device mount, detect a power delivery capability of an external device, and manage power delivery negotiations accordingly.

BACKGROUND

Mobile devices have become ubiquitous for use in military and public safety operations, and often need to interface with external devices such as hubs, radios, and other equipment. USB Type-C Power Delivery protocols in mobile devices are often not compatible with "legacy" external devices that do not inherently support USB Type-C Power Delivery. Currently, users need to swap out cables and decouple/re-couple mobile devices based on whether the connected external device supports USB Type-C Power Delivery or not. This is inconvenient and problematic especially in military and public safety operations where time and resource conservation are of particular importance.

It is with these observations in mind, among others, that various aspects of the present disclosure were conceived and developed.

BRIEF DESCRIPTION OF THE DRAWINGS

FIGS. 3A-3D show an "open" configuration of the device mount and FIG. 3E shows a "closed" configuration of the device mount;

Corresponding reference characters indicate corresponding elements among the view of the drawings. The headings used in the figures do not limit the scope of the claims.

DETAILED DESCRIPTION

Figure 1A:
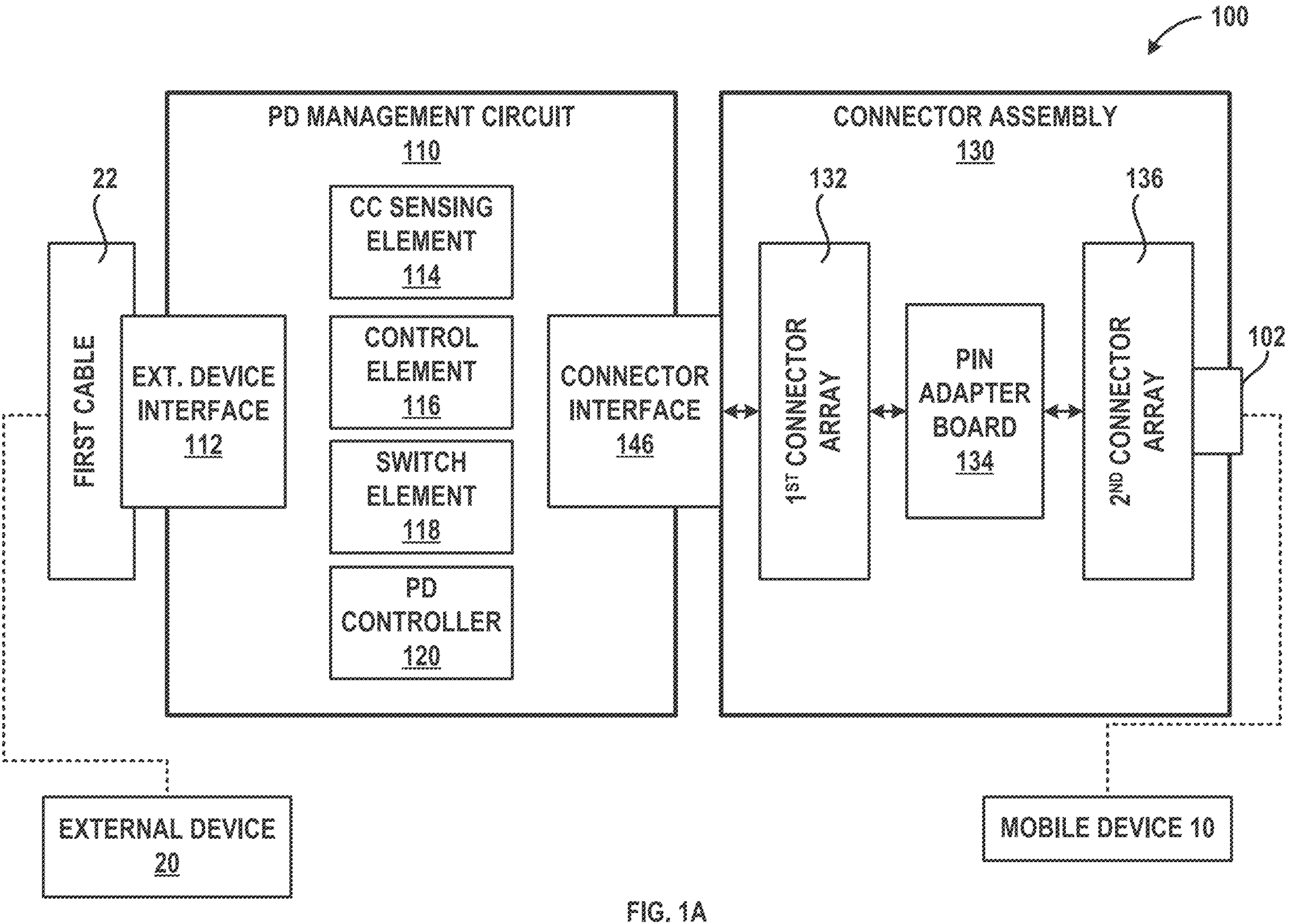
FIGS. 1A and 1B are a pair of schematic diagrams showing a power delivery management assembly outlined herein.

A device mount for a mobile device that includes an integrated power delivery management circuit is outlined herein. The power delivery management circuit enables seamless connection between the mobile device and an external device, where it may be unknown to a user if the external device is compatible with USB Type-C Power Delivery protocols. The power delivery management circuit determines, by a power delivery detect circuit, a power delivery status (e.g., capability) of the external device and configures itself to enable power delivery negotiations between the mobile device and the external device based on the power delivery status. When the power delivery status of the external device is power-delivery incapable, the power delivery management circuit can facilitate power delivery negotiations between the mobile device and the external device on behalf of the external device. Conversely, when the power delivery status of the external device is power-delivery capable, the power delivery management circuit can enable the external device to directly facilitate power delivery negotiations with the mobile device.

The devices outlined herein aim to solve problems currently associated with connection of mobile devices with external devices that may or may not be compatible with USB Type-C Power Delivery protocols. For example, a user using a mobile device having USB Type-C Power Delivery capability may need to connect the mobile device with an external device such as a military radio, which may be capable of providing power to the mobile device but might not support USB Type-C Power Delivery. Problems arise when the mobile device attempts to negotiate Power Delivery roles with external devices that do not support such a protocol. For example, when connected to a radio that does not support USB Type-C Power Delivery, the mobile device will attempt to provide power to the radio instead of drawing power from the radio, thereby draining the battery of the mobile device.

While devices (e.g., cables) exist that can adapt a non-PD legacy device to work with mobile devices having USB Type-C Power Delivery capability, these cables must be manually switched out to allow the mobile device to connect with another external device that does support USB Type-C Power Delivery such as a "hub". In other words, these cables are not versatile enough to be used for different external devices having different power delivery (PD) capabilities. Such an operation can be cumbersome, time-consuming, and sometimes dangerous in the field, especially when the mobile device is already mounted on a device mount. With current methods, a user must: a) know the USB-C Power Delivery capabilities of the external device to connect the correct cable; b) have the correct cable on hand; and c) manually switch out cables as needed, which requires the user to handle both cables and manually decouple the mobile device from the device mount to switch out the cable before reconnecting.

Further, while device mounts exist that can mount a mobile device along chest armor for convenient and hands-free use, these device mounts are not configured to also incorporate additional hardware that facilitates PD connection between the mobile device and an external device. At times, these device mounts either have no integrated connectivity (e.g., requiring the use of external cables), or may have integrated connectivity components that are not compatible with non-PD external devices (or are not compatible with PD external devices). In the case of the latter, users may be required to completely decouple their mobile device from the device mount before connecting the mobile device with a non-PD external device using the proper cable. These device mounts can also have structural integrity problems associated with repeated use, and particularly associated with repeated flexion of the device mount when coupling and decoupling mobile devices. This problem is further compounded when the user needs to repeatedly decouple and re-couple their mobile device when swapping out cables to accommodate the power delivery capabilities (or lack thereof) of the external device.

As such, there exists a need for a device mount with integrated hardware that determines a USB Type-C Power Delivery configuration of an external device and configures itself accordingly to facilitate connection between the external device and a mobile device captured at the device mount. There exists a further opportunity to adapt the device mount to withstand flexion forces associated with repeated and/or forceful coupling and decoupling of the mobile device.

Figure 1B:
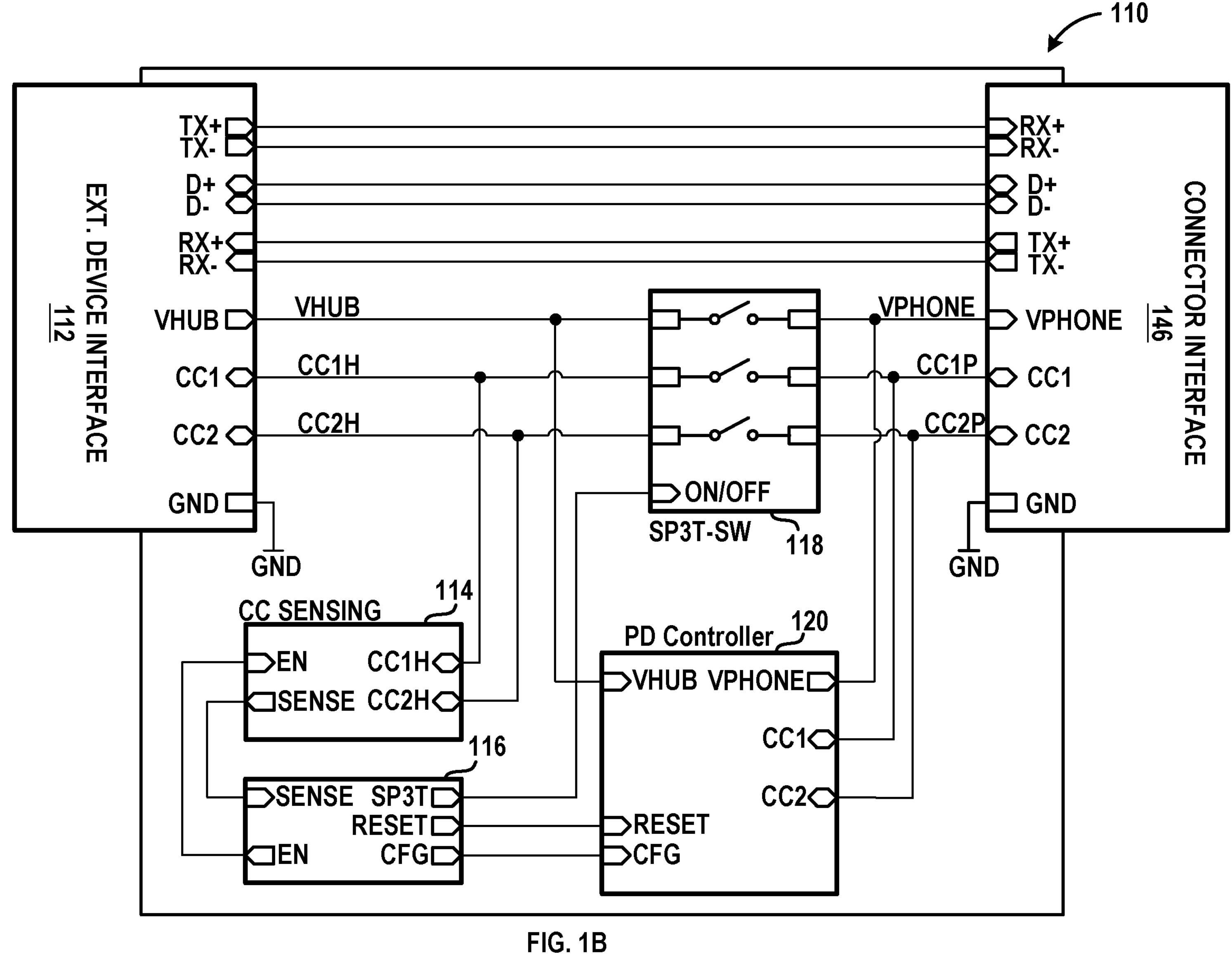

FIGS. 1A and 1B show a power delivery management assembly 100 that enables power delivery connection between a mobile device 10 and an external device 20 regardless of the power delivery capability of the external device 20. The power delivery management assembly 100 enables charging of the mobile device 10 through the external device 20 while allowing the mobile device 10 to act as a "host port" for the external device 20. Without this arrangement and if the external device 20 lacks power delivery capability, under USB Power Delivery protocol the mobile device 10 would attempt to provide power to the external device 20, depleting the battery of the mobile device 10. The power delivery management assembly 100 can be integrated within a device mount (e.g., device mount 300 of FIGS. 3A-3E which can engage chest armor), which is especially useful for situations where it would be inconvenient (and in the context of military or public safety operations, dangerous) to decouple the mobile device 10 from the device mount before connecting with the external device 20. Alternatively, the power delivery management assembly 100 can be integrated within a cable (e.g., cable 400 of FIG. 10A) or another type of device mount, such as a device mount associated with a vehicle or station.

FIG. 1A shows an overview of the power delivery management assembly 100 including a power delivery management circuit ("PD management circuit 110") in communication with a connector assembly 130. As shown, the PD management circuit 110 can include an external device interface 112 which connects with a first cable 22 associated with the external device 20. The PD management circuit 110 includes various components that collectively perform operations including: determining a power delivery status (e.g., capability) of the external device 20; and configuring the PD management circuit 110 to enable or facilitate power delivery negotiations between the mobile device 10 and the external device 20 based on the power delivery status of the external device 20. The PD management circuit 110 is operable to facilitate power delivery negotiations between the mobile device 10 and the external device 20 on behalf of the external device based on the power delivery status of the external device 20 being power delivery incapable. Further, the PD management circuit 110 is operable to enable the external device 20 to directly facilitate power delivery negotiations with the mobile device 10 based on the power delivery status of the external device 20 being power delivery capable.

The PD management circuit 110 includes a configuration channel sensing element ("CC sensing element 114") operable for measuring a voltage at a hub-side configuration channel line associated with the external device 20 which can be used to determine the power delivery status of the external device 20. The PD management circuit 110 can further include a control element 116 such as a processor in communication with a memory which is operable for determining the power delivery status of the external device based on the voltage, and which is further operable for configuring the PD management circuit 110 to enable or facilitate power delivery negotiations between the mobile device 10 and the external device 20. The PD management circuit 110 can include a switch element 118, and a power delivery controller ("PD controller 120", not to be confused with control element 116). The switch element 118 and the PD controller 120 collectively enable or facilitate power delivery negotiations between the mobile device 10 and the external device 20 based on signals provided by the control element 116 as outlined further herein with respect to FIGS. 1B and 2. The PD management circuit 110 can include a connector interface 146 which connects the PD management circuit 110 with the mobile device 10 through the connector assembly 130.

The connector assembly 130 serves to adapt the output of the PD management circuit 110 to a plug 102 compatible with the mobile device 10. The connector assembly 130 can be separable from the PD management circuit 110 for modularity, e.g., to use a different type of plug. Generally, the connector assembly 130 can include a first connector array 132 that connects with the connector interface 146 of the PD management circuit 110. In some embodiments, the first connector array 132 can include a set of pogo pins (also known as "spring-loaded" pins). The connector assembly 130 can further include a pin adapter board 134 that manages pin connections and adapts the first connector array 132 to a second connector array 136 associated with the plug 102. The plug 102 can extend outwards from the connector assembly 130 housed within the device mount 300 to interface with a port of the mobile device 10.

FIG. 1B is a schematic diagram of an example embodiment of the PD management circuit 110. The external device interface 112 communicates with the first cable 22 and the connector interface 146 connects the PD management circuit 110 with the mobile device 10 through the connector assembly 130 as discussed herein with reference to FIG. 1A. The external device interface 112 notably includes a "hub-side" power pin "VHUB" which can electrically couple with a power pin of the external device 20, and the connector interface 146 includes a "phone-side" power pin "VPHONE" which can electrically couple with a power pin of the mobile device 10. The external device interface 112 further includes a first "hub-side" configuration channel pin "CC1H" and a second "hub-side" configuration channel pin "CC2H" which can electrically couple with configuration channel pins of the external device 20. Likewise, the connector interface 146 includes a first "phone-side" configuration channel pin "CC1P" and a second "phone-side" configuration channel pin "CC2P" which can electrically couple with configuration channel pins of the mobile device 10.

The CC sensing element 114 and is operable for measuring a voltage at a hub-side configuration channel line (CC1H and/or CC2H) associated with the external device 20, looking for specific voltage levels associated with power delivery capability (or lack thereof) of the external device 20. In one example implementation, the CC sensing element 114 can monitor for voltage levels as defined within USB Type-C Spec R2.0. The CC sensing element 114 communicates with the control element 116 (which can itself communicate with a memory as further discussed herein with respect to FIG. 11) which performs operations associated with system monitoring and configuration of the PD management circuit 110. The control element 116 determines a PD configuration of the external device 20 based on an output of the CC sensing element 114. Upon determining the PD configuration of the external device 20, the control element 116 configures the switch element 118 and the PD controller 120 accordingly.

The control element 116 can be a processor (as in FIG. 1B) in communication with a memory (see FIG. 11) that is operable to determine the power delivery status of the external device 20 based on the voltage measured by the CC sensing element 114, the voltage correlating with a power delivery status of the external device 20 (i.e., either indicating that the power delivery status of the external device 20 is power delivery capable or power delivery incapable). The control element 116 can also configure, based on the power delivery status of the external device 20, the power delivery management circuit to enable power delivery negotiations between the mobile device 10 and the external device 20 by applying control signals to the switch element 118 and the PD controller 120 to facilitate or otherwise enable power delivery negotiations between the mobile device 10 and the external device 20 based on the power delivery status of the external device 20.

In some examples, the control element 116 can be an integrated circuit (such as an application-specific integrated circuit (ASIC)) that may or may not include a microprocessor. In examples where the control element 116 does not include a microprocessor, the control element 116 may have dedicated circuitry that collectively perform operations including determining the power delivery status of the external device 20 based on the voltage measured by the CC sensing element 114 and configure, based on the power delivery status of the external device 20, the power delivery management circuit to enable power delivery negotiations between the mobile device 10 and the external device 20 by applying control signals to the switch element 118 and the PD controller 120 to facilitate or otherwise enable power delivery negotiations between the mobile device 10 and the external device 20 based on the power delivery status of the external device 20.

The switch element 118 can be a "single-pull, triple throw" switch (SPTT) that opens and closes in response to control signals from the control element 116. As shown, the switch element 118 can include a first sub-switch between the hub-side power pin VHUB and the phone-side power pin VPHONE, a second sub-switch between the first hub-side configuration channel line CC1H and the first phone-side configuration channel line CC1P, and a third sub-switch between the second hub-side configuration channel line CC2H and the second phone-side configuration channel line CC2P. The control element 116 can configure or toggle a state of the switch element 118 between an "open" state in which the first, second, and third sub-switches are "open" and a "closed" state in which the first, second, and third sub-switches are "closed".

When the switch element 118 is in the "open" state, the switch element 118 isolates the hub-side power pin VHUB of the external device 20 and the phone-side power pin VPHONE of the mobile device 10 from one another. In addition, when the switch element 118 is in the "open" state, the switch element 118 isolates the first and second hub-side configuration channel lines CC1H and CC2H associated with the external device 20 from the first and second phone-side configuration channel lines CC1P and CC2P associated with the mobile device 10. As such, when the switch element 118 is in the "open" state, the external device 20 and the mobile device 10 are prevented from directly facilitating power delivery negotiations with one another. This allows the PD controller 120 to instead facilitate USB power delivery protocol on behalf of the external device 20 when the external device 20 is PD incapable.

Conversely, when the switch element 118 is in the "closed" state, the switch element 118 electrically couples the hub-side power pin VHUB of the external device 20 with the phone-side power pin VPHONE of the mobile device 10. In addition, when the switch element 118 is in the "closed" state, the switch element 118 electrically couples the first and second hub-side configuration channel lines CC1H and CC2H associated with the external device 20 with the first and second phone-side configuration channel lines CC1P and CC2P associated with the mobile device 10. Importantly, when the switch element 118 is in the "closed" state, the external device 20 and the mobile device 10 can directly facilitate power delivery negotiations with one another when the external device 20 is PD capable (rather than through the PD controller 120).

The control element 116 can configure the switch element 118 in the "open" state that electrically decouples the mobile device 10 from the external device 20 prior to measurement of the voltage at the CC sensing element 114 (i.e., prior to determining the power delivery status of the external device 20). The control element 116 is operable to configure the switch element 118 in the closed state based on the power delivery status of the external device 20 being power delivery capable such that the switch element 118 enables direct facilitation of USB power delivery protocol between the external device 20 and the mobile device 10. However, when the power delivery status of the external device 20 is found to be power delivery incapable based on measurement of the voltage at the CC sensing element 114, the control element 116 is operable to hold or otherwise maintain the switch element 118 in the open state that electrically decouples the mobile device 10 from the external device 20 such that the external device 20 and the mobile device 10 are prevented from attempting directly facilitating power delivery negotiations with one another.

The PD controller 120 is operable for facilitating USB power delivery protocol on behalf of the external device 20 when the power delivery status of the external device 20 is PD-incapable. As shown, the PD controller 120 can also connect between VHUB and VPHONE, and receives control signals from the control element 116. The PD controller 120 further includes a hub-side configuration channel lines (CC1H and CC2H), "CC1" and a second configuration channel pin "CC2" that can respectively connect with the first and second "phone-side" configuration channel lines (CC1P and CC2P), associated with the mobile device 10. The control element 116 can configure or toggle a state of the PD controller 120 between a "reset" state in which the PD controller 120 does not operate, and an "interfacing" state in which the PD controller 120 facilitates USB PD protocol between the mobile device 10 and the external device 20 on behalf of the external device 20. Using standard USB PD protocols, the PD controller 120 engages in a data exchange with the mobile device 10 via first and second configuration channel lines CC1 and CC2, reconfiguring a USB interface of the mobile device 10 to enable charging and data hosting functionalities with respect to the external device 20. In other words, upon determination by the CC sensing element 114 and control element 116 of the PD management circuit 110 that the power delivery status of the external device 20 is power delivery incapable (such as when the external device 20 does not have its own PD controller), the PD controller 120 acts as a surrogate PD controller on behalf of the external device 20.

When the PD controller 120 is in the "interfacing" state, the PD controller 120 facilitates USB power delivery protocol on behalf of the external device 20 when the power delivery status of the external device 20 is PD incapable. Note that when the PD controller 120 is in the "interfacing" state, the switch element 118 should also be in the "open" state such that the external device 20 and the mobile device 10 are prevented from directly facilitating power delivery negotiations with one another. This prevents conflicting information from being exchanged (i.e., prevents the PD controller 120 and the external device 20 from attempting to simultaneously facilitate power delivery negotiations).

Conversely, when the PD controller 120 is in the "reset" state, the PD controller 120 is prevented from facilitating USB power delivery protocol between the mobile device 10 and the external device 20 on behalf of the external device 20.

The control element 116 can configure the PD controller 120 in the "reset" state prior to measurement of the voltage at the CC sensing element 114 (i.e., prior to determining the power delivery status of the external device 20). The control element 116 is operable to configure the PD controller 120 in the interfacing state based on the power delivery status of the external device 20 being power delivery capable such that the PD controller 120 facilitates USB power delivery protocol on behalf of the external device 20. However, when the power delivery status of the external device 20 is found to be power delivery incapable based on measurement of the voltage at the CC sensing element 114, the control element 116 is operable to hold or otherwise maintain the power delivery controller 120 in the reset state that prevents the power delivery controller 120 from facilitating USB power delivery protocol between the mobile device 10 and the external device 20 on behalf of the external device 20.

Figure 2:
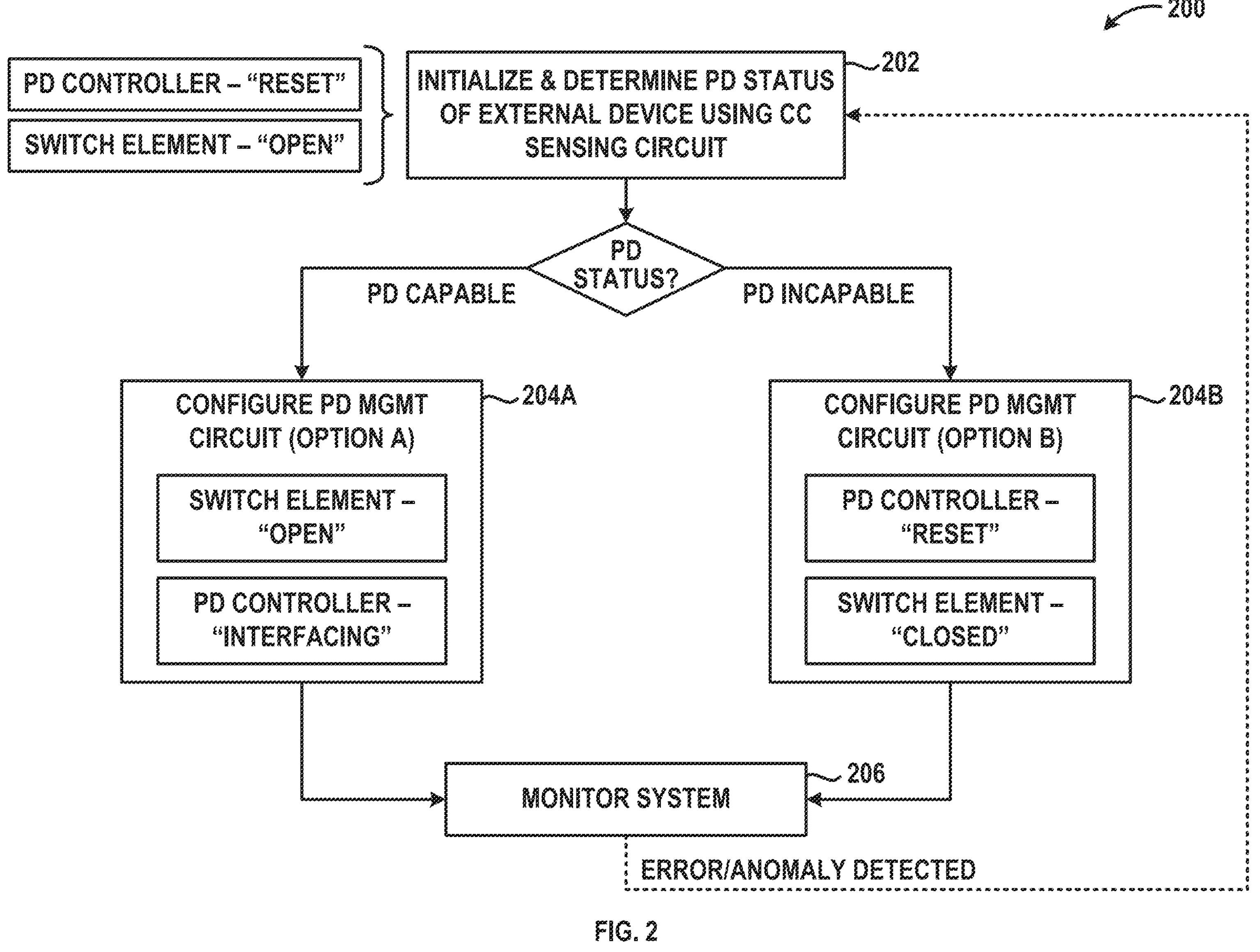
FIG. 2 is a simplified diagram showing a process implemented by the power delivery management assembly of FIGS. 1A and 1B.

With additional reference to FIG. 2, a method 200 implemented by the control element 116 of the PD management circuit 110 includes the following steps.

At Step 202 of method 200: Upon power-up, an initial task of the control element 116 is to determine a PD status of the external device 20. To achieve this, the control element 116 can provide control signals to the other components of the PD management circuit 110, including:

i) Applying control signals to the PD controller 120 that configure the PD controller 120 in "reset" state to temporarily prevent any PD communications between the mobile device 10 and the external device 20. This is done prior to measurement of the voltage by the CC sensing element 114.

ii) Applying control signals to the switch element 118 that configure the switch element 118 in "open" state to temporarily isolate VHUB from VPHONE, CCH1 from CCP1, and CCH2 from CCP2. This is done prior to measurement of the voltage by the CC sensing element 114.

iii) Activating the CC sensing element 114 to monitor CCH1 and CCH2 (configuration channel lines associated with the external device 20), which have been isolated due to the "open" state of the switch element 118 and the "reset" state of the PD controller 120.

iv) Measuring voltages on CCH1 and CCH2 using the CC sensing element 114 to discern the PD status of the external device 20. Based on the measured voltages, the control element 116 classifies the PD capability of the external device 20 as PD capable (i.e., having a PD controller of its own or otherwise able to conduct PD negotiations), or PD incapable (e.g., a "legacy" hub that lacks a PD controller of its own or is otherwise unable to conduct PD negotiations). In some examples, voltage ranges for classification of the external device 20 by the control element 116 are dependent upon voltage ranges associated with a presence (or lack thereof) of pull-up resistors and/or pull-down resistors associated with an existing PD controller and/or fixed PD configuration that may belong to the external device 20 (e.g., 56 k pull-up resistors "Rp" and/or 5.1 k pull-down resistors "Rd" as defined within USB Type-C Spec R2.0).

Based on the PD configuration of the external device 20 detected by the control element 116, the control element 116 can generate control signals that configure the PD management circuit 110 accordingly. There are two options for this step, as follows:

Step 204A of method 200: Should the control element 116 identify that the power delivery status of the external device 20 is PD incapable at step 202, the control element 116 generates control signals to:

i) Leave, hold, or otherwise configure the switch element 118 in the "open" state to isolate VHUB from VPHONE, CCH1 from CCP1, and CCH2 from CCP2. When the switch element 118 is in the "open" state, the external device 20 and the mobile device 10 are prevented from directly facilitating power delivery negotiations with one another. This allows the PD controller 120 to instead facilitate USB power delivery protocol on behalf of the external device 20 when the external device 20 is PD incapable.

ii) Configure the PD controller 120 in the "interfacing" state to provide a power-delivery interface to the mobile device 10 on behalf of the external device 20. Using standard USB power delivery protocols, the PD controller 120 engages in a data exchange with the mobile device 10 through CC1 (see pin CC1 of PD controller 120 in FIG. 1B) and CC1P and through CC2 (see pin CC2 of PD controller 120 in FIG. 1B) and CC2P, reconfiguring a USB interface of the mobile device 10 to enable the mobile device 10 to receive power from the external device 20. The PD controller 120 also connects VHUB to VPHONE to charge the mobile device 10 once the USB interface of the mobile device 10 has been configured by the PD controller 120 to receive power from the external device 20. When the PD controller 120 is in the "interfacing" state, the PD controller 120 facilitates USB power delivery protocol on behalf of the external device 20.

Step 204B of method 200: Alternatively, should the control element 116 identify that the power delivery status of the external device 20 is PD capable at step 202 (e.g., with a functional PD controller of its own or being hard-wired to assume a PD role), the control element 116 generates control signals to:

i) Leave, hold, or otherwise configure the PD controller 120 in the "reset" state in which the PD controller 120 is prevented from operating (neither configured nor allowed to operate). When the PD controller 120 is in the "reset" state, the PD controller 120 is prevented from facilitating USB power delivery protocol between the mobile device 10 and the external device 20 on behalf of the external device 20.

ii) Configure the switch element 118 in the "closed" state to establish a direct "pass-through" connection between VHUB and VPHONE, between CC1H and CC1P, and between CC2H and CC2P. When the switch element 118 is in the "closed" state, the mobile device 10 and the external device 20 can engage in direct negotiation for the power and data hosting connection using their own respective PD controllers without interference from the PD controller 120.

Step 206 of method 200: The control element 116 continuously monitors for errors and anomalies until either the mobile device 10 or external device 20 are disconnected. In case of any detected issues, the control element 116 initiates a full reset and re-starts the process at step 202.

The functions performed in the processes and methods may be implemented in differing order. Furthermore, the outlined steps and operations are provided as examples, and some of the steps and operations may be optional, combined into fewer steps and operations, or expanded into additional steps and operations without detracting from the essence of the disclosed embodiments.

As used herein, direction or relational terms such as "front," "back," and "side" are used to facilitate understanding and discussion, not limitation. For example, these terms generally provide context for viewing embodiments and understanding relative positions and orientations of associated components. Likewise, the terms "parallel," "perpendicular" and so on are also used to describe relationships and relative positions of components. In this regard, it should be understood that these terms are not used in their absolute sense but are instead used to describe general orientations and configurations. For example, the term "substantially" may be used herein to generalize the disclosed relationships and relative positions of components to account for manufacturing tolerances and minor design modifications/alterations that do not depart from the spirit and scope of this disclosure. As used herein, the terms "coupled", "secured," and/or "engaged" (and variations thereof) refer to components being mechanically and/or electrically connected to each another either directly or indirectly or through one or more intermediary components. Finally, it is also appreciated that the illustrated devices and structures may include a plurality of the same component referenced by the same number. It is appreciated that depending on the context, the description may interchangeably refer to an individual component or use a plural form of the given component(s) with the corresponding reference number.

Figure 3A:
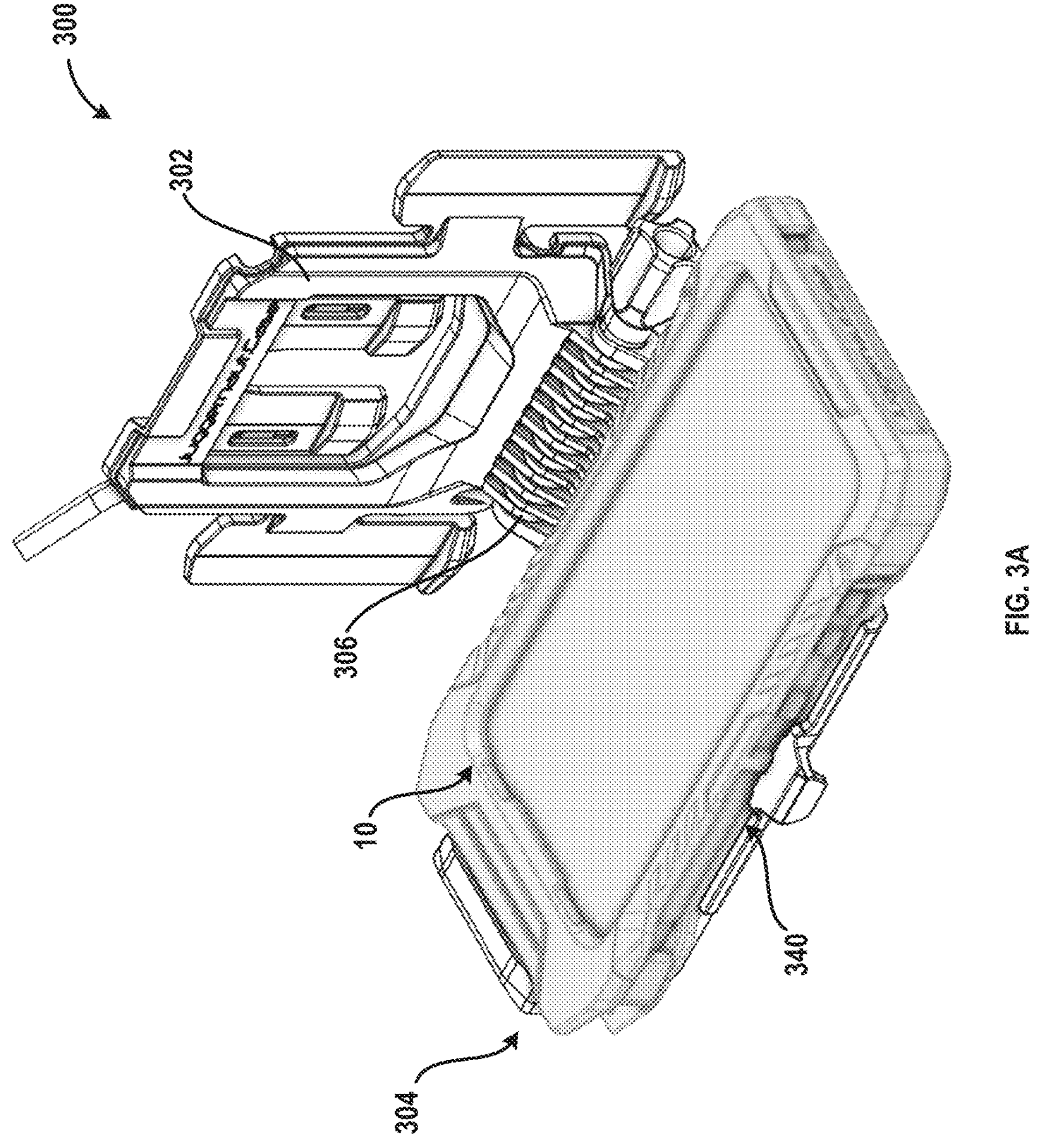
FIGS. 3A-3E are a series of illustrations showing a device mount with integrated power delivery detection engaged with a mobile device as outlined herein, where
Figure 3B:
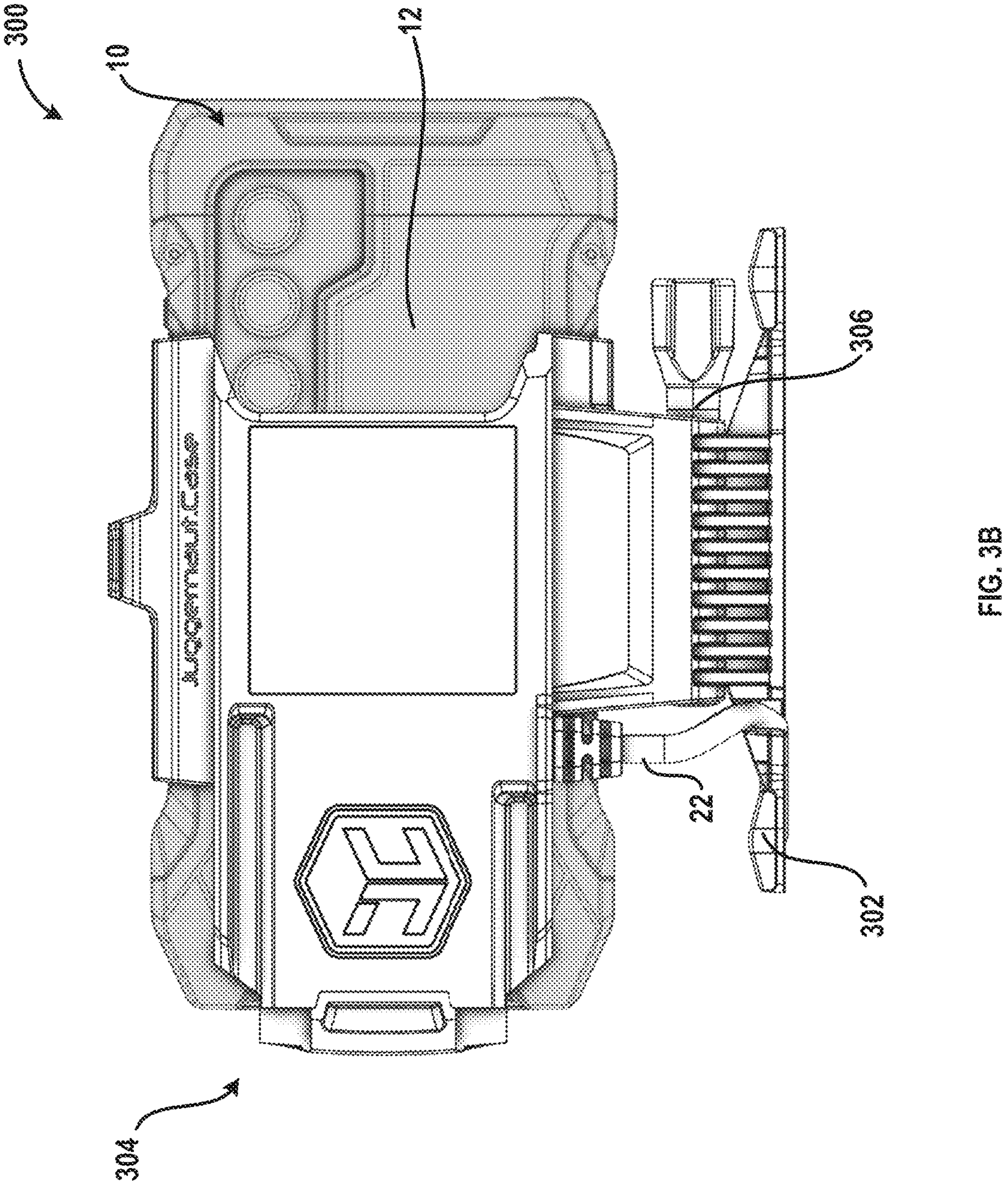
Figure 3C:
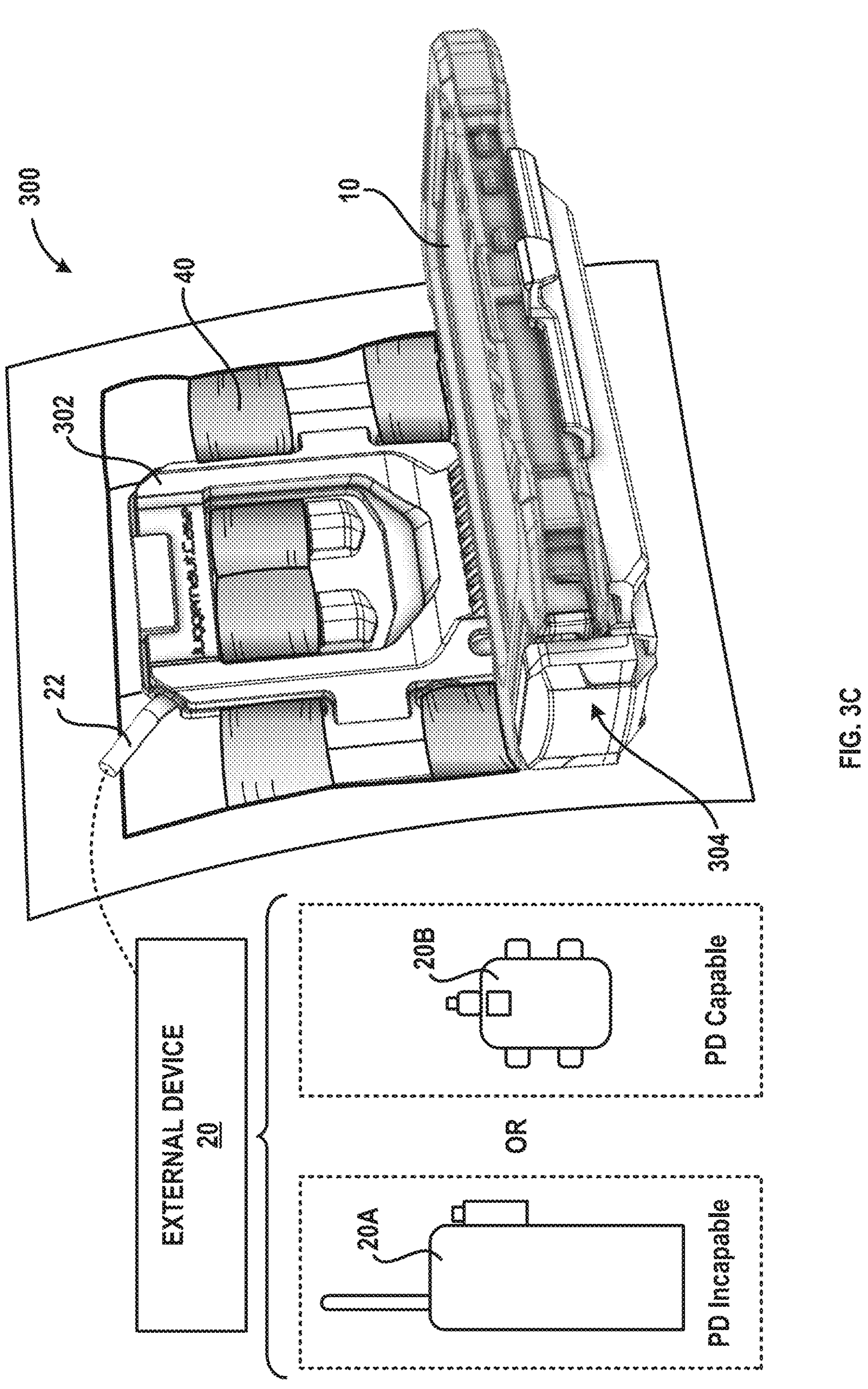

FIGS. 3A-3E show a device mount 300 having a mount portion 302 and a device holder portion 304 having a device cavity 340 that captures the mobile device 10. In the example shown, the device mount 300 is configured to be chest-mounted, e.g., along a chest armor piece worn by a user. The mount portion 302 and the device holder portion 304 can be connected at a joint portion 306 that couples the device holder portion 304 to the mount portion 302, where the device holder portion 304 is rotatable about the joint portion 306 between a first position ("open" configuration of FIGS. 3A-3D) and a second position ("closed" configuration of FIG. 3E) relative to the mount portion 302. As shown in FIGS. 3B and 3C, the device mount 300 includes a first cable 22 that connects the mobile device 10 with an external device 20, which may or may not support USB Type-C Power Delivery. The device holder portion 304 engages a backside 12, a port 14 (FIG. 3D) and peripheral edges of the mobile device 10 as shown.

Figure 3D:
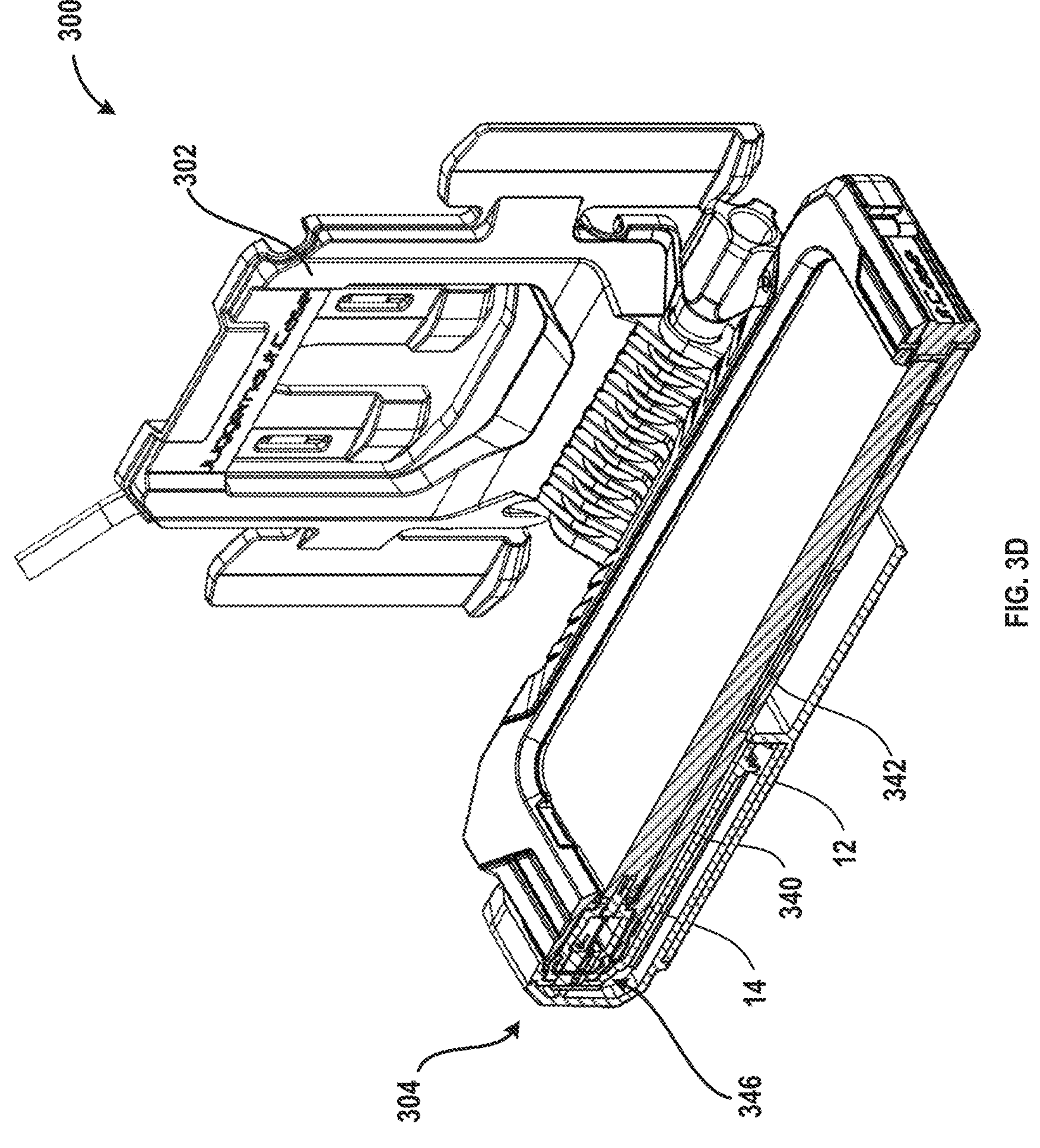

In FIG. 3C, two examples of the external device 20 are shown: a first external device 20A (e.g., a radio) that lacks a Power Delivery ("PD") controller (and does not support USB Type-C Power Delivery) and a second external device 20B (e.g., a hub) that has a PD controller or is otherwise already configured into a PD role (and does support USB Type-C Power Delivery). FIG. 3C also shows engagement of the mount portion 302 with a mount receptacle 40, which can be positioned along a surface for easy access such as a chest armor plate, a backpack, or another device. FIG. 3D shows a cutaway view of the device mount 300 with the mobile device 10 captured within the device cavity 340 of the device holder portion 304. In this view, the backside 12 of the mobile device 10 is shown contacting a planar section 342 of the device cavity 340 discussed in further greater detail herein. Further, the port 14 of the mobile device 10 engages a dock section 346 of the device holder portion 304 as shown.

Figure 3E:
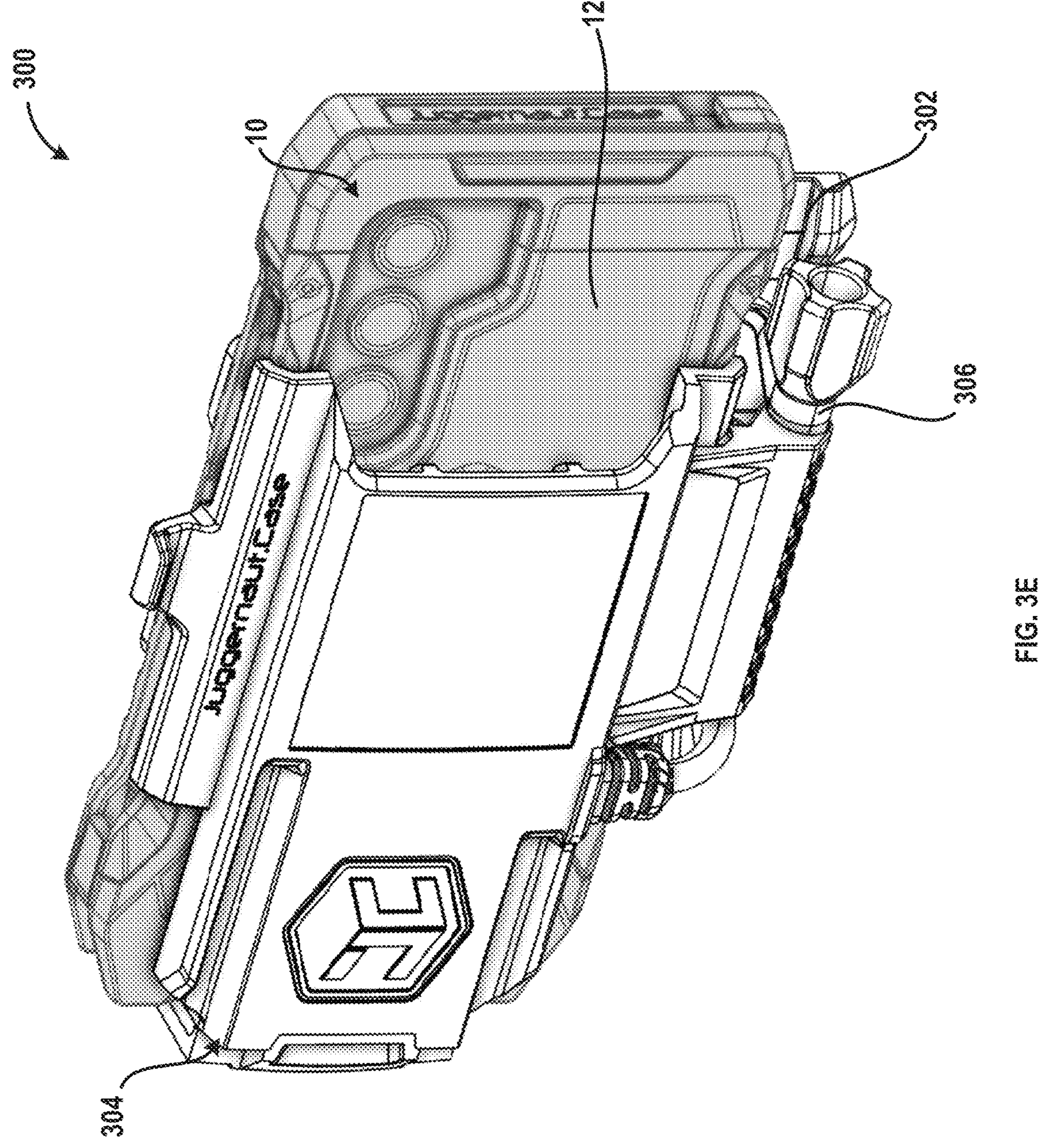

In the front perspective view of FIG. 3A, the device holder portion 304 is shown in the first position, e.g., an "open" configuration in which a plane generally defined by the device holder portion 304 is substantially perpendicular to a plane generally defined by the mount portion 302. In contrast, FIG. 3E shows a front perspective view of the device mount 300 in which the device holder portion 304 is rotated about the joint portion 306 to the second position, e.g., where the plane generally defined by the device holder portion 304 is substantially parallel to the plane generally defined by the mount portion 302.

Figure 4A:
FIGS. 4A-4C are a series of illustrations showing perspective, rear, and side views of the device mount of FIGS. 3A-3E with the mobile device removed.
Figure 4A:
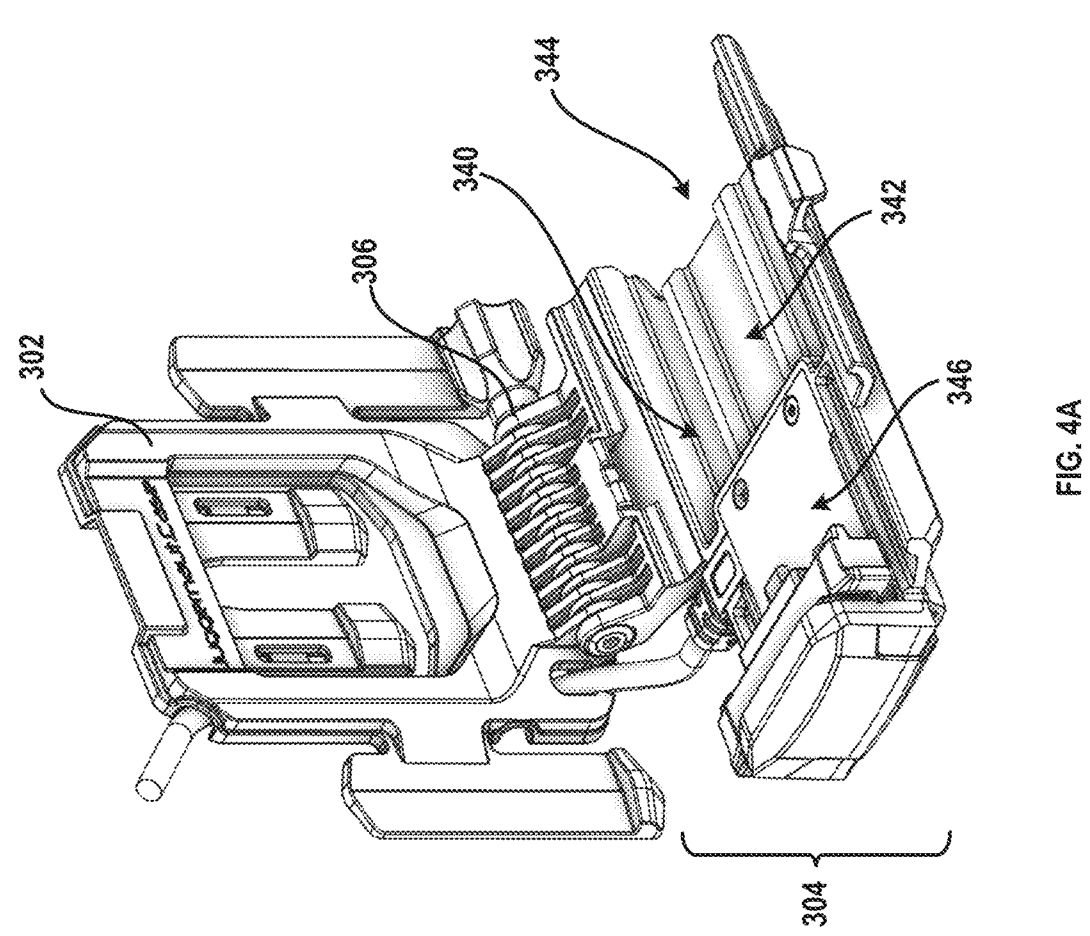
Figure 4C:
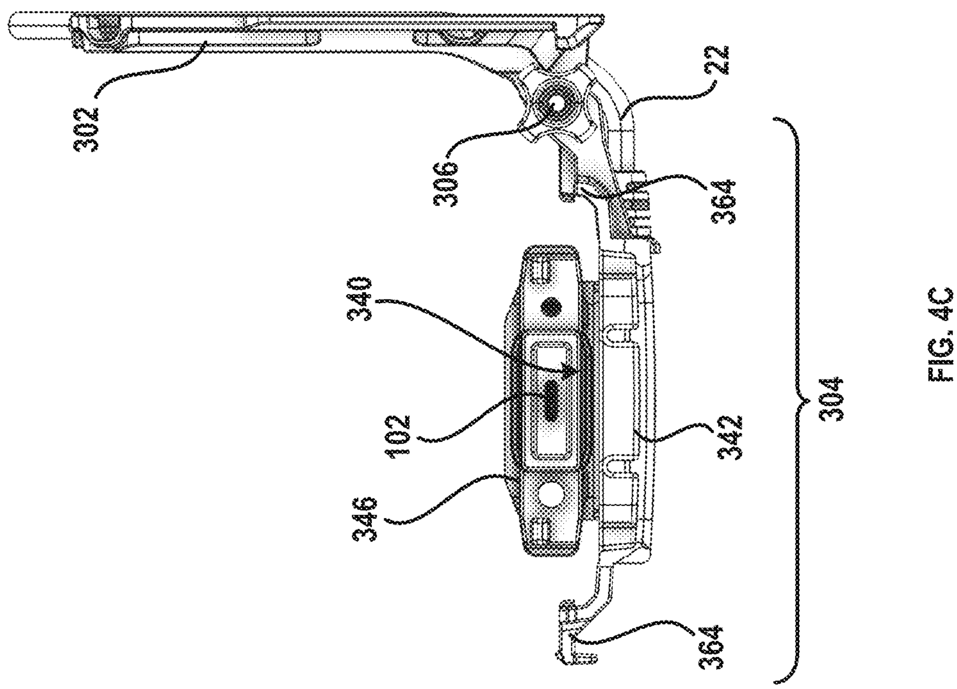
Figure 4B:
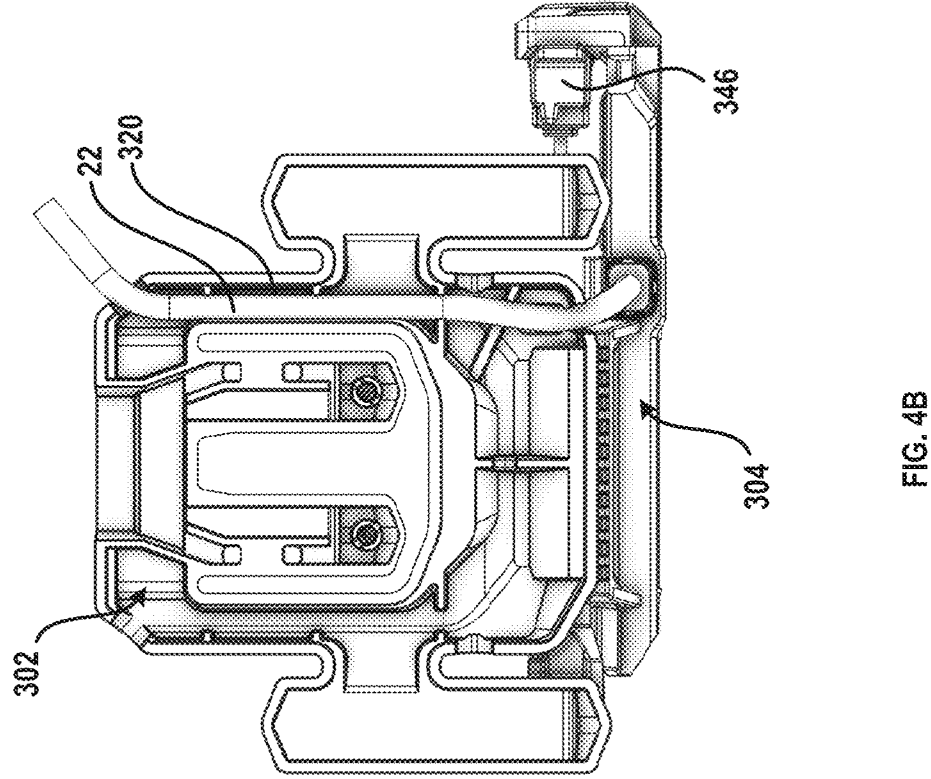

FIGS. 4A-4C illustrate the device mount 300 with the mobile device 10 (FIGS. 3A-3E) removed. As shown, the device holder portion 304 includes the device cavity 340 that captures the mobile device 10 therein. The device cavity 340 can be collectively defined by the planar section 342 that captures the backside 12 of the mobile device 10, an open section 344 that receives the mobile device 10 into the device cavity 340, and the dock section 346 that engages the port 14 of the mobile device 10 and houses various Power Delivery management components of the device mount 300, e.g., power delivery management circuit discussed in further detail herein. The dock section 346 can include an exterior surface 376 visible in FIG. 4A. As discussed herein, the dock section 346 can be at a first lateral side of the planar section 342 and the open section 344 can be at a second lateral side of the planar section 342.

FIG. 4B shows a rear view of the device mount 300, particularly illustrating a cable channel 320 of the mount portion 302 that captures the first cable 22 for communication to the dock section 346 of the device holder portion.

FIG. 4C shows a side view of the device mount 300 in the second position, particularly illustrating a view of the device mount 300 "looking" from the second lateral side of the planar section 342 associated with the open section 344

(labeled in FIG. 4A). In FIG. 4C, the device holder portion 304 is shown oriented substantially perpendicular to the mount portion 302 when in the second position, coupled at the joint portion 306. The first cable 22 is also visible in FIG. 4C, and communicates with the dock section 346 as shown. Importantly, the dock section 346 includes a plug 102 that engages the port 14 of the mobile device (FIGS. 3A-3E), where the plug 102 is in electrical communication with the first cable 22 as discussed in further detail herein. FIG. 4C also shows a pair of walls 364 of the planar section 342 that extend upwards to define peripheral edges of the device cavity 340 and are thus configured to capture peripheral edges of the mobile device 10 within the device cavity 340.

Figure 5:
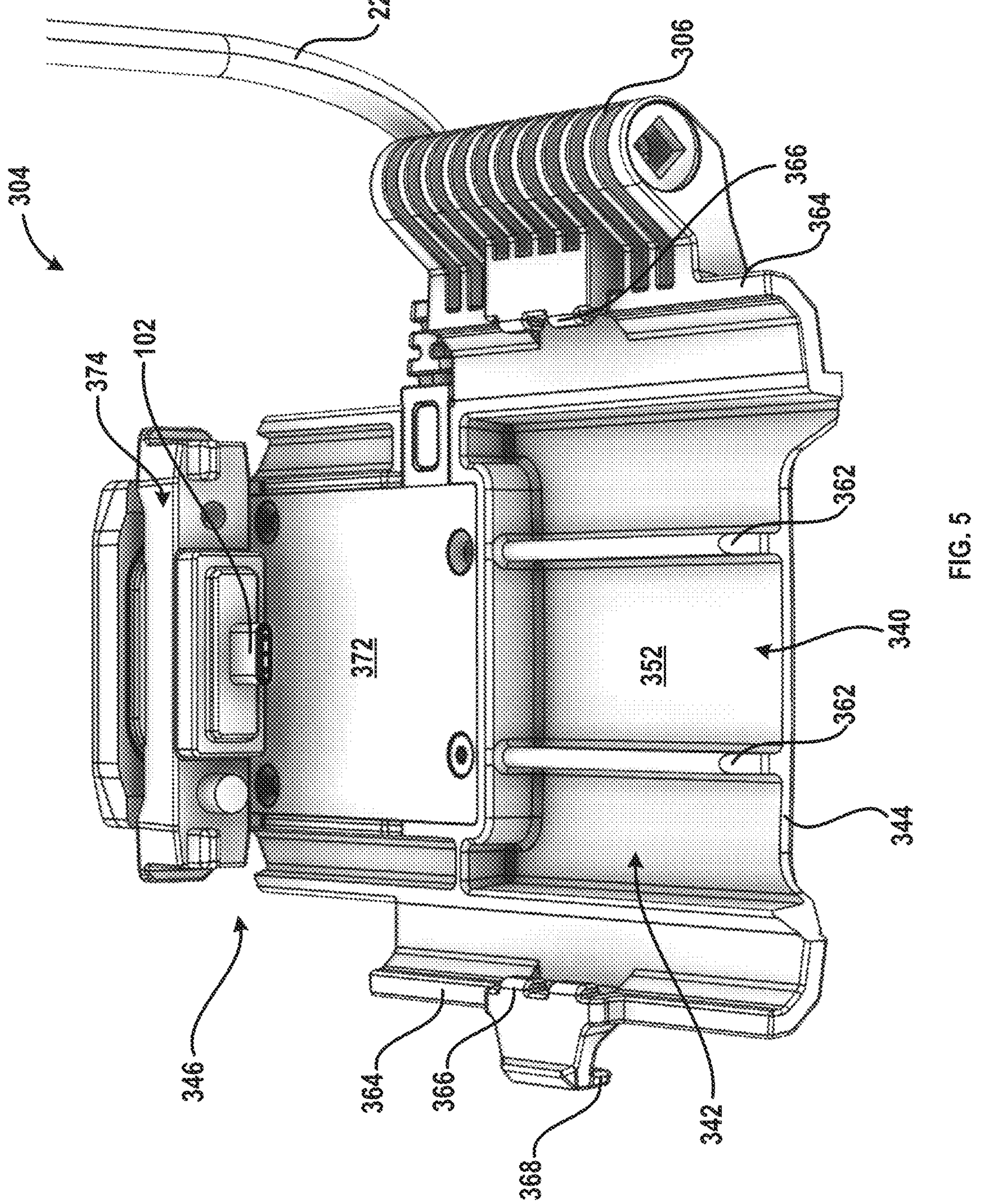
FIG. 5 is an illustration showing a side view of a device holder portion of the device mount of FIGS. 4A-4C.

FIG. 5 shows the device holder portion 304 of the device mount 300 isolated from the mount portion 302 (FIGS. 4A-4C). The planar section 342 is shown having an interior surface 352 defining ribs 362 that run parallel to the walls 364 of the planar section 342 (e.g., and parallel to a direction of elongation of the mobile device 10 of FIGS. 3A-3E). FIG. 5 further shows tabs 366 that extend “inward” from the walls 364 of the planar section 342 that capture the peripheral edges of the mobile device 10 in a snap-fit engagement to secure the mobile device 10 within the device cavity 340. One of the tabs 366 (e.g., the tab 366 opposite from the joint portion 306) can include a thumb gripping portion 368 that provides a gripping surface for flexion of the associated wall 364 of the planar section 342 away from the peripheral edges of the mobile device 10 to enable removal of the mobile device 10 from the device cavity 340. The ribs 362 of the mount portion 302 provide structural stability to the mount portion 302, allowing flexion of the walls 364 of the planar section 342 while resisting flexion of the planar section 342 perpendicular to the ribs 362.

Further, FIG. 5 shows the open section 344 of the mount portion 302 opposite from the dock section 346. The dock section 346 is also shown in FIG. 5, and includes a first dock portion 372 in electrical communication with a second dock portion 374. The first dock portion 372 engages the first cable 22 and is positioned along the planar section 342 such that the first dock portion 372 is flush with a backside 12 of the mobile device 10 (FIGS. 3A-3E) when the mobile device 10 is engaged within the device cavity 340. The first dock portion 372 can house the PD management circuit 110 of FIGS. 1A and 1B to facilitate connection between the mobile device 10 and the external device 20 (FIG. 3C). In some examples, the first dock portion 372 can also provide further structural support for the mount portion 302 and can resist flexion of the planar section 342 perpendicular to the ribs 362.

As further shown, the second dock portion 374 extends upward to engage the port 14 (FIG. 3D) of the mobile device 10. Importantly, the second dock portion 374 includes the plug 102 that engages the port 14 of the mobile device 10 and can house the connector assembly 130 of FIG. 1A that connect the plug 102 with the PD management circuit 110 housed within the first dock portion 372.

Figure 6:
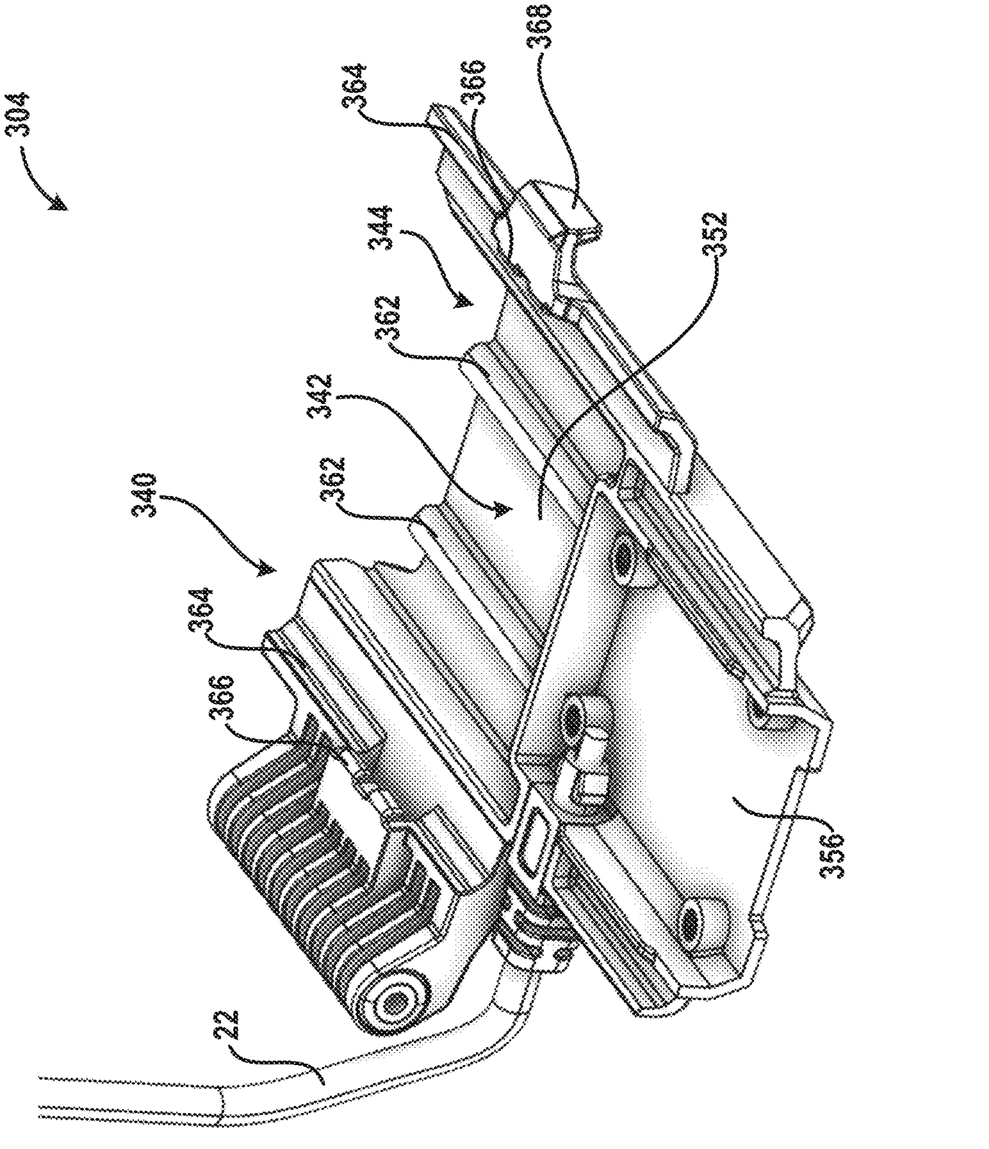
FIG. 6 is an illustration showing a perspective view of the device holder portion of FIG. 5 with a dock section removed.

FIG. 6 illustrates the mount portion 302 with the dock section 346 (FIG. 5) removed. As shown, the planar section 342 defines a dock cavity 356 that receives the first dock portion 372 (FIG. 5) of the dock section 346, e.g., where the first dock portion 372 is positionable within the dock cavity 356. The first cable 22 is shown terminating within the dock cavity 356.

Figure 7A:
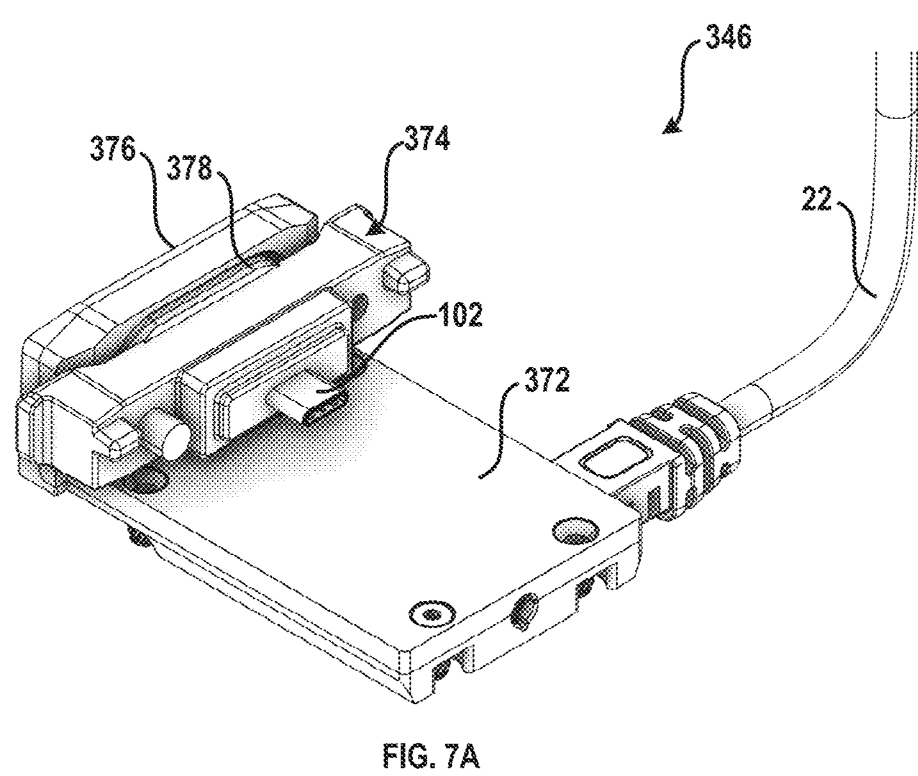
FIGS. 7A and 7B are a pair of illustrations respectively showing a perspective view and a cutaway perspective view of a dock section of the device holder portion of FIG. 5.
Figure 7B:
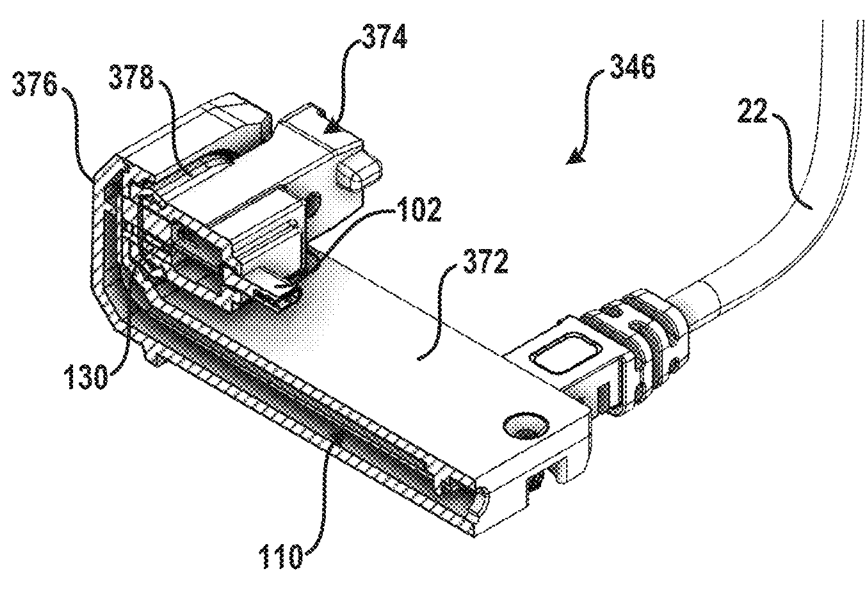

FIGS. 7A and 7B illustrate the dock section 346 of the mount portion 302 isolated from the planar section 342. As shown, the first cable 22 couples with the first dock portion 372 which includes various power delivery management components of the device mount 300 to facilitate connection between the mobile device 10 and the external device 20 (FIGS. 1A and 1B). The first dock portion 372 can extend “upwards” as shown to define the exterior surface 376 and protect the power delivery management assembly 100 as well as the port 14 (FIG. 3D) of the mobile device 10.

The second dock portion 374 can be removeable from the first dock portion 372 and houses various connection elements to adapt the power delivery management components within the first dock portion 372 to interface with the plug 102, where the plug 102 is configured for engagement with the mobile device 10. FIGS. 7A and 7B also show a gasket 378 of the dock section 346 that provides a protective seal between the first dock portion 372 and the second dock portion 374.

FIG. 7B shows a cutaway view of the dock section 346 in which internal components of the dock section 346 are visible. In the example of FIG. 7B, the first dock portion 372 can house the power delivery management circuit 110 of FIGS. 1A and 1B, which can be in the form of a printed circuit board (PCB) or can be constructed from a plurality of individual connected components. The second dock portion 374 can include the connector assembly 130 in electrical communication with the power delivery management circuit 110 that terminates in the plug 102.

Figures 8A, 8B:
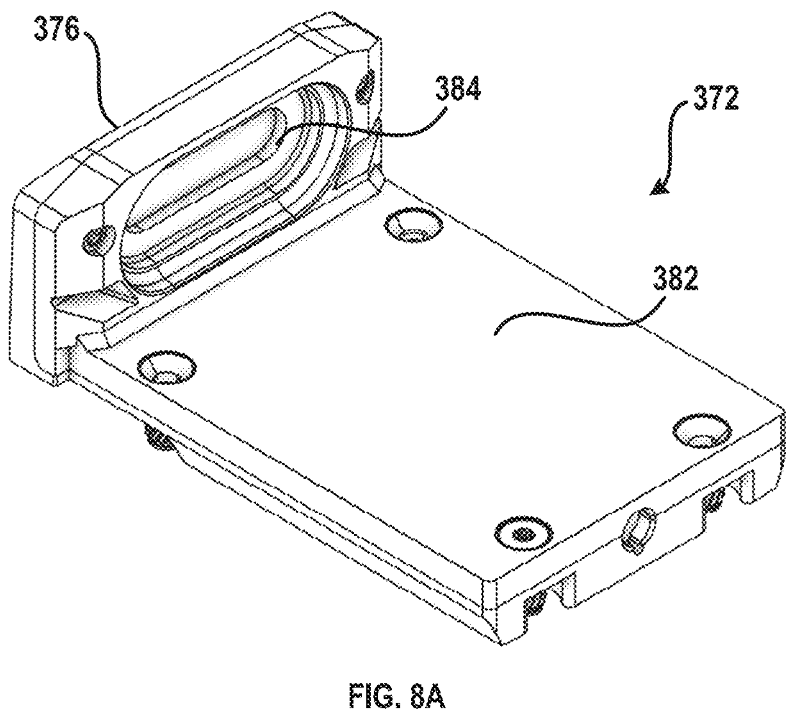
FIGS. 8A and 8B are a pair of illustrations respectively showing a perspective view and a cutaway perspective view of a first dock portion of the dock section of FIGS. 7A and 7B.

FIGS. 8A and 8B show the first dock portion 372 of the dock section 346. The first dock portion 372 can include a dock housing 382 that encapsulates the power delivery management circuit 110 therein. The dock housing 382 can define a generally planar shape that fits within the dock cavity 356 of the planar section 342 (FIG. 6) with a substantially perpendicular portion that forms the exterior surface 376 to protect the power delivery management assembly 100 (FIG. 1A) as well as the port 14 of the mobile device 10. The dock housing 382 can define a connector receptacle 384 that receives the second dock portion 374.

In the cutaway view of FIG. 8B, the first dock portion 372 can house a primary board 142 that includes various components of the power delivery management assembly 100 (FIG. 1A), such as the power delivery management circuit 110 which can be in the form of a printed circuit board (PCB). The first dock portion 372 can also house the connector interface 146 of the power delivery management circuit 110, which can be positioned within the substantially perpendicular portion to interface with the connector assembly 130 when the first dock portion 372 is engaged with the second dock portion 374 as shown in FIGS. 7A and 7B. The connector interface 146 can connect with the primary board 142 by a ribbon connection 144 or other suitable element that enables arrangement of the connector interface 146 perpendicular to the primary board 142.

Figures 9A, 9B:
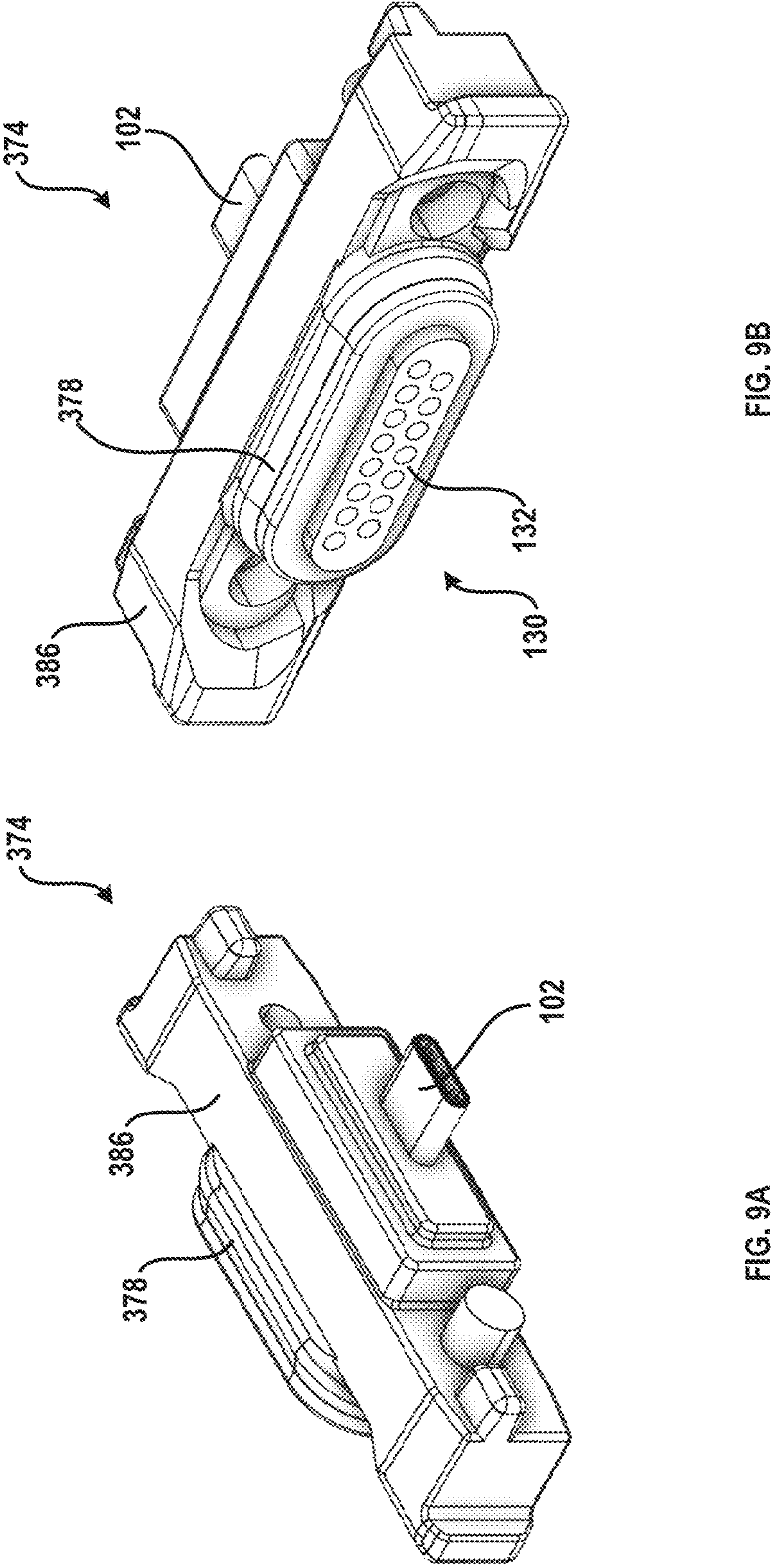
FIGS. 9A-9C are a series of illustrations showing a front perspective view, a rear perspective view, and a cutaway perspective view of a second dock portion of the dock section of FIGS. 7A and 7B.
Figure 9C:
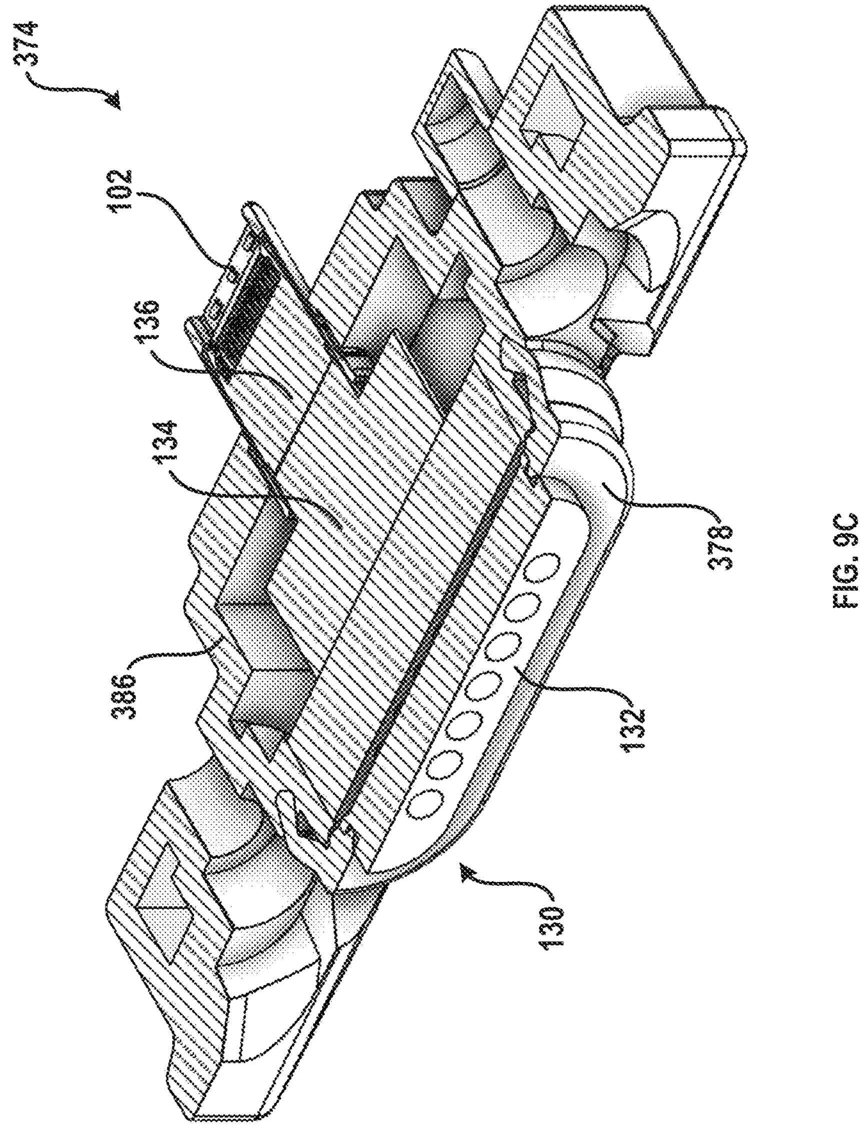

FIGS. 9A-9C show the second dock portion 374 of the dock section 346. The second dock portion 374 can include a connector housing 386 that encapsulates the connector assembly 130 therein. The second dock portion 374 can house the first connector array 132 of the connector assembly 130 that engages the connector interface 146 of FIG. 8B, as well as the plug 102 that engages the port 14 (FIG. 3D) of the mobile device 10. The gasket 378 can be positioned around the first connector array 132 to interface with the connector receptacle 384 of the first dock portion 372 shown in FIGS. 8A and 8B. As illustrated in the cutaway view of FIG. 9C, the second dock portion 374 can include the second connector array 136 associated with the plug 102, and the pin adapter board 134 that manages pin connections and adapts the first connector array 132 to the second connector array 136 as shown.

In the examples shown, the plug 102 is a USB-C plug that is compatible with many smartphones currently available on the market. However, in other examples, the plug 102 can be compatible with other types of ports that may belong to the mobile device. The second dock portion 374 can also include or omit certain structural features that interface with or otherwise accommodate various protective covers for the mobile device. The second dock portion 374 can be separable from the remainder of the dock section 346 for modularity, e.g., to enable a user to switch out one embodiment or component of the second dock portion 374 in favor of another embodiment or component of the second dock portion 374 that may be sized or shaped to accommodate a certain protective cover for the mobile device or that may include a different type of plug 102 that is compatible with the mobile device.

Figure 10A:
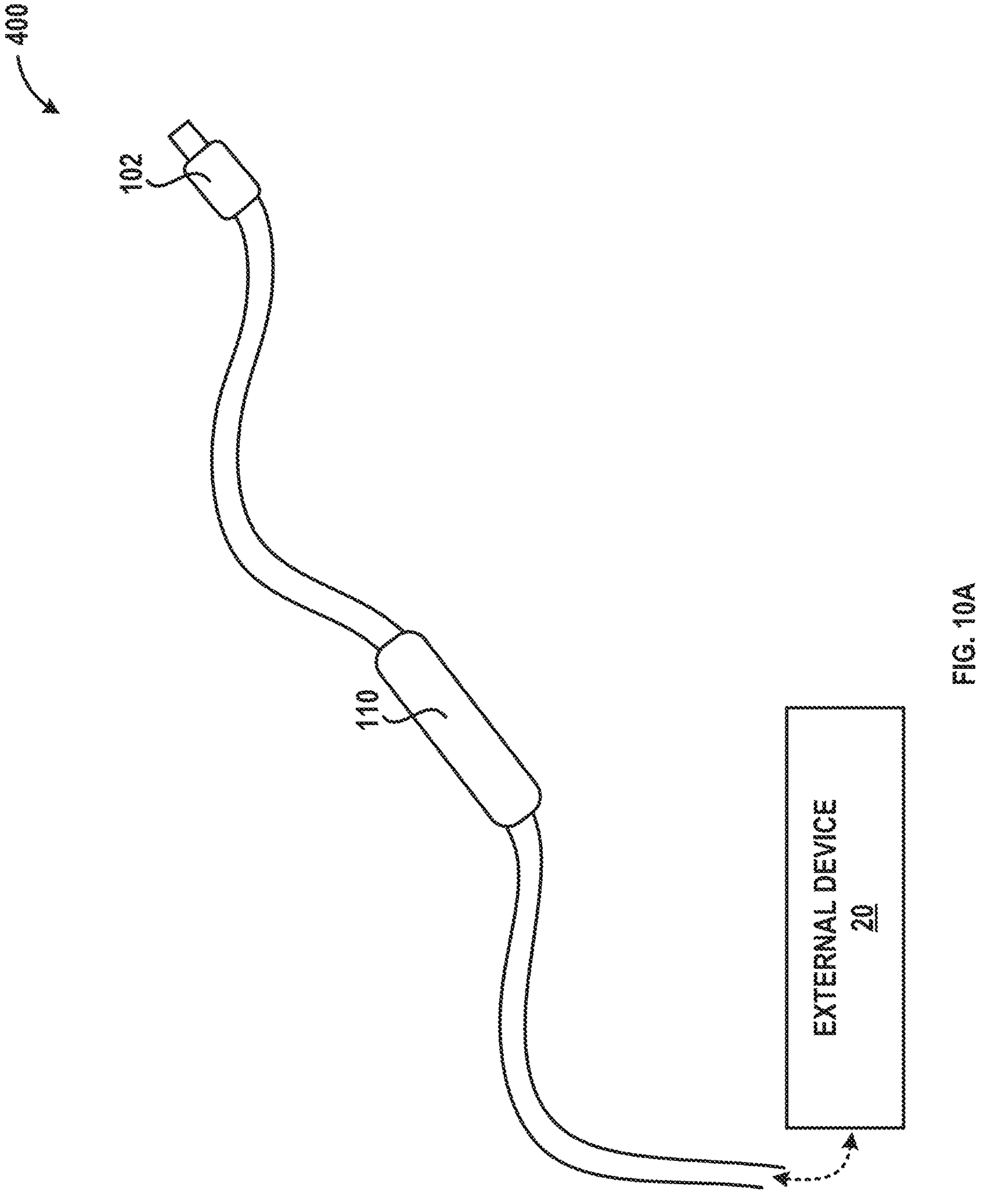
FIG. 10A is a simplified illustration showing a cable with integrated power delivery management as outlined herein.

FIG. 10A is an illustration showing an alternate embodiment of the PD management circuit 110 of FIGS. 1A and 1B integrated within a cable 400. As shown, the cable 400 includes the plug 102 at one end and interfaces with the external device 20 at the other end. The PD management circuit 110 integrated within the cable 400 can facilitate PD protocol on behalf of the external device 20 as discussed herein with reference to FIGS. 1A-2.

Figure 10B:
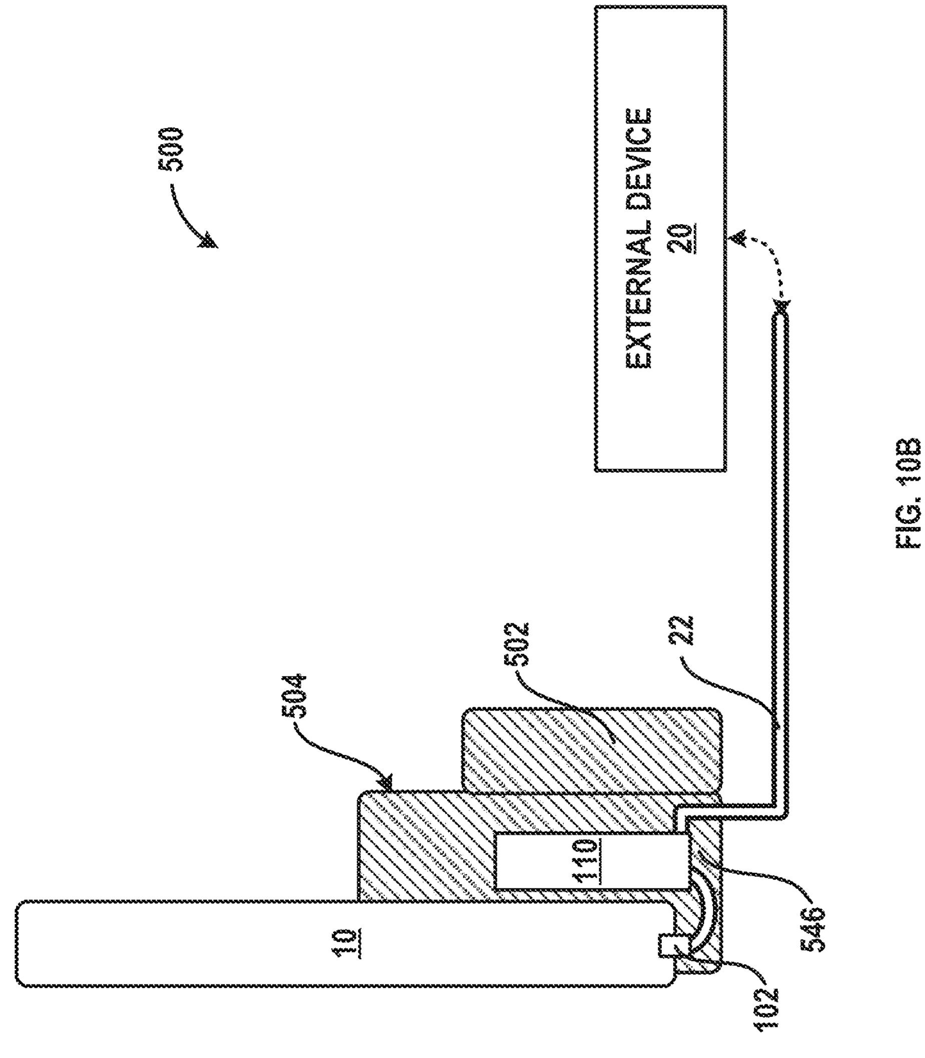
FIG. 10B is a simplified illustration showing a device mount with integrated power delivery management.

FIG. 10B is an illustration showing a generalized embodiment of a device mount 500 that includes a device holder defining a device holder portion 504 engaged with a mount portion 502 and configured to engage a mobile device 10, the device holder portion 504 including a dock section 546. The dock section 546 can include a power delivery management circuit 110 in communication with a first cable 22 and a plug 102, the plug 102 being configured for engagement with a port of the mobile device 10. As outlined above, the power delivery management circuit 110 is operable to: determine a power delivery status of an external device 20 in communication with the first cable 22; and configure, based on the power delivery status of the external device 20, the power delivery management circuit 110 to enable power delivery negotiations between the mobile device 10 and the external device 20.

Computer-Implemented System

Figure 11:
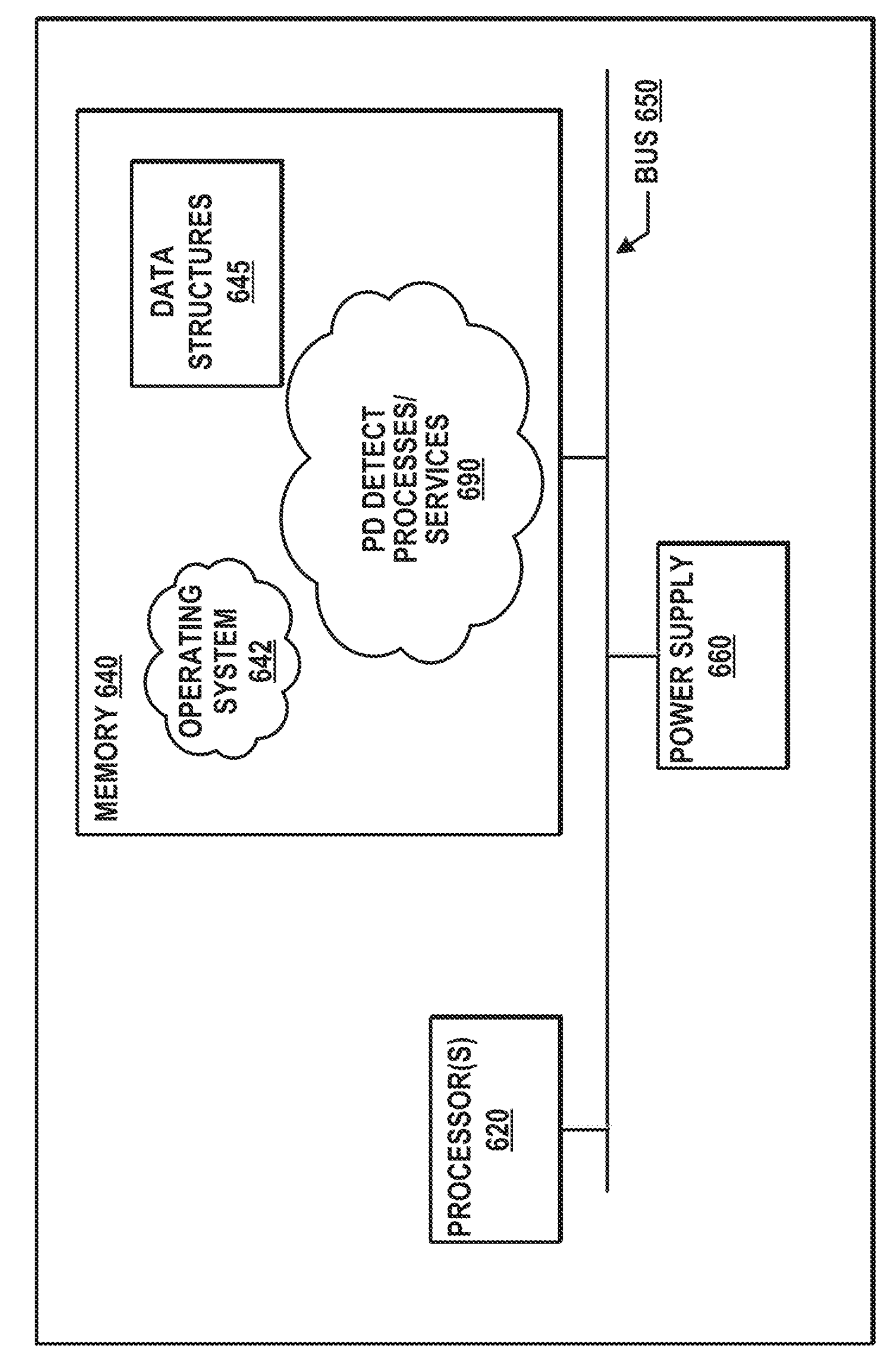
FIG. 11 is a simplified diagram showing an exemplary computing system including a processor for implementation of the power delivery management circuit of FIGS. 1A and 1B.

FIG. 11 is a schematic block diagram of an example device 600 that may be used as part of one or more embodiments described herein, e.g., as a component of the PD management circuit 110 including the control element 116 shown in FIGS. 1A and 1B and implementing method 200 shown in FIG. 2.

Device 600 comprises at least one processor 620 (e.g., control element 116), and a memory 640 interconnected by a system bus 650, as well as a power supply 660 (e.g., battery, plug-in, etc.).

Memory 640 includes a plurality of storage locations that are addressable by processor 620 for storing software programs and data structures associated with the embodiments described herein. In some embodiments, device 600 may have limited memory or no memory (e.g., no memory for storage other than for programs/processes operating on the device and associated caches). Memory 640 can include instructions executable by the processor 620 that, when executed by the processor 620, cause the processor 620 to implement aspects of the PD management circuit 110 and the method 200 outlined herein.

Processor 620 comprises hardware elements or logic adapted to execute the software programs (e.g., instructions) and manipulate data structures 645. An operating system 642, portions of which are typically resident in memory 640 and executed by the processor, functionally organizes device 600 by, inter alia, invoking operations in support of software processes and/or services executing on the device. These software processes and/or services may include PD Detect processes/services 690, which can include aspects of method 200 and/or implementations of various modules described herein.

It will be apparent to those skilled in the art that other processor and memory types, including various computer-readable media, may be used to store and execute program instructions pertaining to the techniques described herein. For example, the memory 640 can include a non-transitory computer readable medium including instructions encoded thereon, the instructions being executable by a processor to perform aspects of PD Detect processes/services 690. Also, while the description illustrates various processes, it is expressly contemplated that various processes may be embodied as modules or engines configured to operate in accordance with the techniques herein (e.g., according to the functionality of a similar process). In this context, the term module and engine may be interchangeable. In general, the term module or engine refers to model or an organization of interrelated software components/functions. Further, while the PD Detect processes/services 690 is shown as a standalone process, those skilled in the art will appreciate that this process may be executed as a routine or module within other processes.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A device mount, comprising:

a device holder defining a device holder portion engaged with a mount portion and configured to engage a mobile device, the device holder portion including a dock including:

a power delivery management circuit in communication with a first cable and a plug, the plug being configured for engagement with a port of the mobile device, the power delivery management circuit being operable to:

determine a power delivery status of an external device in communication with the first cable based on a voltage at a hub-side configuration channel line associated with the external device; and configure, based on the power delivery status of the external device, the power delivery management circuit to enable power delivery negotiations between the mobile device and the external device;

the power delivery management circuit including:

a configuration channel sensing element operable to measure the voltage at the hub-side configuration channel line associated with the external device; and a control element in communication with the configuration channel sensing element, the control element being operable to determine the power delivery status of the external device based on the voltage.

2. The device mount of claim 1, the power delivery management circuit being operable to facilitate power delivery negotiations between the mobile device and the external device on behalf of the external device based on the power delivery status of the external device being power delivery incapable.

3. The device mount of claim 1, the power delivery management circuit being operable to enable the external device to directly facilitate power delivery negotiations with the mobile device based on the power delivery status of the external device being power delivery capable.

4. The device mount of claim 1, the power delivery management circuit including:

a power delivery controller in communication with the external device, the power delivery controller being operable to facilitate USB power delivery protocol between a mobile device and the external device on behalf of the external device when in an interfacing state; and the control element in communication with the power delivery controller, the control element being operable to configure the power delivery controller in the interfacing state based on the power delivery status of the external device being power delivery incapable.

5. The device mount of claim 4, the control element being operable to configure, prior to determining the power delivery status of the external device, the power delivery controller in a reset state that prevents the power delivery controller from facilitating USB power delivery protocol between the mobile device and the external device on behalf of the external device.

6. The device mount of claim 1, the power delivery management circuit including:

a switch element in communication with the external device and the mobile device, the switch element enabling direct facilitation of USB power delivery protocol between the external device and the mobile device when in a closed state; and the control element in communication with the switch element, the control element being operable to configure the switch element in the closed state based on the power delivery status of the external device being power delivery capable.

7. The device mount of claim 6, the control element being operable to configure, prior to determining the power delivery status of the external device, the switch element in an open state that electrically decouples the mobile device from the external device.

8. The device mount of claim 1, further comprising:

a joint portion that couples the device holder portion to the mount portion, where the device holder portion is rotatable about the joint portion between a first position and a second position relative to the mount portion.

9. A device mount, comprising:

a device holder defining a device holder portion engaged with a mount portion and configured to engage a mobile device, the device holder portion including a dock including:

a power delivery management circuit in communication with a first cable and a plug, the plug being configured for engagement with a port of the mobile device, the power delivery management circuit being operable to:

determine a power delivery status of an external device in communication with the first cable based on a voltage at a hub-side configuration channel line associated with the external device; and configure, based on the power delivery status of the external device, the power delivery management circuit to enable power delivery negotiations between the mobile device and the external device;

the device holder portion including:

a planar section that contacts a backside of the mobile device;

a dock section positioned at a first lateral side of the planar section that houses the power delivery management circuit and includes the plug that engages the port of the mobile device; and a device cavity collectively defined by the planar section and the dock section that captures the mobile device therein.

10. The device mount of claim 9, the dock section being removeable from the planar section and including:

a first dock portion that receives the first cable and houses the power delivery management circuit in electrical communication with the first cable, the first dock portion being positionable within a dock cavity of the planar section and including an exterior surface oriented substantially perpendicular to the planar section; and a second dock portion that engages the port of the mobile device and houses a pin adapter that establishes electrical communication between the power delivery management circuit of the first dock portion and the plug.

11. A power delivery management circuit, comprising:

a configuration channel sensing element operable to measure a voltage at a hub-side configuration channel line associated with an external device;

a power delivery controller in communication with the external device, the power delivery controller being operable to facilitate USB power delivery protocol between a mobile device and the external device on behalf of the external device when in an interfacing state;

a switch element in communication with the external device and the mobile device, the switch element enabling direct facilitation of USB power delivery protocol between the external device and the mobile device when in a closed state; and a control element in communication with the configuration channel sensing element, the power delivery controller, and the switch element, the control element being operable to:

configure, based on the voltage, the power delivery management circuit to enable power delivery negotiations between the mobile device and the external device, the voltage correlating with a power delivery status of the external device.

12. The power delivery management circuit of claim 11, the control element being operable to configure the power delivery controller in the interfacing state based on the voltage, the voltage indicating that the power delivery status of the external device is power delivery incapable.

13. The power delivery management circuit of claim 11, the control element being operable to configure the switch element in the closed state based on the voltage, the voltage indicating that the power delivery status of the external device is power delivery capable.

14. The power delivery management circuit of claim 11, the switch element being configured to isolate the hub-side configuration channel line from a phone-side configuration channel line associated with the mobile device when in an open state and the switch element being configured to electrically couple the hub-side configuration channel line with the phone-side configuration channel line when in the closed state.

15. The power delivery management circuit of claim 11, the switch element being configured to isolate a hub-side power pin of the external device from a phone-side power pin of the mobile device when in an open state and the switch element being configured to electrically couple the hub-side power pin of the external device with the phone-side power pin of the mobile device when in the closed state.

16. The power delivery management circuit of claim 11, the control element being operable to:

configure, prior to measurement of the voltage, the power delivery controller in a reset state that prevents the power delivery controller from facilitating USB power delivery protocol between the mobile device and the external device on behalf of the external device; and configure, prior to measurement of the voltage, the switch element in an open state that electrically decouples the mobile device from the external device.

17. The power delivery management circuit of claim 11, the control element being operable to:

hold, based on the voltage indicating that the power delivery status of the external device is power delivery capable, the power delivery controller in a reset state that prevents the power delivery controller from facilitating USB power delivery protocol between the mobile device and the external device on behalf of the external device.

18. The power delivery management circuit of claim 11, the control element being operable to:

hold, based on the voltage indicating that the power delivery status of the external device is power delivery incapable, the switch element in an open state that electrically decouples the mobile device from the external device.

* * * * *